(12) United States Patent
Biery et al.

(10) Patent No.: US 7,705,405 B2
(45) Date of Patent: Apr. 27, 2010

(54) METHODS FOR THE FORMATION OF FULLY SILICIDED METAL GATES

(75) Inventors: Glenn A. Biery, Staatsburg, NY (US); Michelle L. Steen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 10/885,462

(22) Filed: Jul. 6, 2004

(65) Prior Publication Data
US 2006/0006476 A1    Jan. 12, 2006

(51) Int. Cl.
*H01L 21/336* (2006.01)

(52) U.S. Cl. ............... 257/388; 257/382; 257/383; 257/384; 257/412; 257/E21.439

(58) Field of Classification Search .......... 257/E21.439, 257/388
See application file for complete search history.

(56) References Cited

U.S. PATENT DOCUMENTS

| 6,376,320 | B1 * | 4/2002 | Yu ............... 438/303 |
| 6,555,453 | B1 | 4/2003 | Xiang et al. |
| 6,562,718 | B1 * | 5/2003 | Xiang et al. ............ 438/682 |
| 6,620,718 | B1 | 9/2003 | Wieczorek et al. |
| 6,846,734 | B2 * | 1/2005 | Amos et al. ............ 438/592 |
| 7,183,187 | B2 * | 2/2007 | Lu et al. ............... 438/592 |
| 2002/0072231 | A1 * | 6/2002 | Liao et al. ............ 438/682 |
| 2002/0098659 | A1 * | 7/2002 | Hsieh et al. ........... 438/303 |
| 2004/0094804 | A1 * | 5/2004 | Amos et al. ............ 257/369 |
| 2005/0056881 | A1 | 3/2005 | Yeo et al. |
| 2005/0215038 | A1 * | 9/2005 | Hall et al. ............. 438/583 |

FOREIGN PATENT DOCUMENTS

CN    1599078 A    6/2004

OTHER PUBLICATIONS

Qu et al., "Thermal stability, phase and interface uniformity of Ni-silicide formed by Ni-Si solid-state reaction," Thin Solid Films, V. 462-463 (2004) pp. 146-150.*
Kittl, J.A., et al., "Applications of Ni-Based Silicides to 45NM CMOS and Beyond" Materials Research Society, Pittsburgh, PA., vol. 810, Jan. 1, 2004, pp. 31-42.
Cabral, C., et al., "Dual Workfunction Fully Silicided Metal Gates", VLSI Technology, 2004, Digest of Technical papers, 2004 Symposium of Honolulu HI, Jun. 15-17, 2004.
Cartier, E., et al., "Systematic Study of pFET V1 with Hf-Based Gate Stacks with Poly-Si and FUSI Gates", VLSI Technology, 2004, Digest of Technical Papers, 2004 Symposium of Honolulu HI, Jun. 15-17, 2004, pp. 44-45.

(Continued)

*Primary Examiner*—Kenneth A Parker
*Assistant Examiner*—Jose R Diaz
(74) *Attorney, Agent, or Firm*—Scully, Scott, Murphy & Presser, P.C.; Louis J. Percello, Esq.

(57) ABSTRACT

An advanced gate structure that includes a fully silicided metal gate and silicided source and drain regions in which the fully silicided metal gate has a thickness that is greater than the thickness of the silicided source/drain regions is provided. Methods of forming the advanced gate structure are also provided.

7 Claims, 20 Drawing Sheets

OTHER PUBLICATIONS

Tavel, B., et al., "Totally Silicided (CoSi2) Polysilicon: A Novel Approach to Very Low-Resistive Gate (/spl sim/2/spl Omega//pl square/) Without Metal CMP Nor Etching", International Electron Devices Meeting, New York, MY Dec. 2, 2001, pp. 37.5-137.5 4.

Anil, K.G., et al. "Demonstration of Fully Ni-Silicided Metal Gates or Hfo2 Based High-k Gate Dielectrics as a Candidate for Low Power Applications", VLSI Technology, 2004, Digest of Technical Papers, 2004 Symposium of Honolulu HI, Jun. 15-17, 2004, pp. 190-191.

* cited by examiner

METHODS FOR THE FORMATION OF FULLY SILICIDED METAL GATES

RELATED APPLICATIONS

This application is related to co-pending and co-assigned U.S. application Ser. No. 10/605,261, filed Sep. 18, 2003, entitled "PROCESS OPTIONS OF FORMING SILICIDED METAL GATES FOR ADVANCED CMOS". The entire content of the aforementioned U.S. patent application is incorporated herein by reference.

FIELD OF THE INVENTION

The present invention relates to a semiconductor device and methods of fabricating the same, and more particularly to a metal oxide semiconductor (MOS) device that includes an advanced gate structure, e.g., fully silicided metal gate, as well as methods of fabricating the fully silicided metal gate device.

BACKGROUND OF THE INVENTION

Throughout the prior art, metal gate integration has proven difficult to achieve in a conventional process flow for MOS transistors. Most metal gate materials interact with the gate dielectric during the high temperature processing needed for source/drain (S/D) junction activation anneals. The need to keep the metal gate stack from receiving high temperature anneals has lead to the development of the "gate last" or "replacement gate" process for which the gate stack is fabricated last and remains below 500° C. during subsequent processing. Although the prior art replacement gate process increases the number of material choices for a metal gate, the process complexity and cost increases.

It is known in the prior art to form self-aligned silicided metal gates from a polysilicon gate using the processing steps shown, for example, in FIGS. 1A-1D. Specifically, the prior art process begins with providing the structure shown in FIG. 1A, which structure includes a semiconductor substrate 12, an isolation region 15, gate regions 16L and 16R, a gate dielectric 18, a polySi gate conductor 20 and a cap layer 22. Spacers 24 are located on each gate region as well. As shown, the source/drain implants are performed with the cap layer 22 atop the polySi conductor 20. Next, the cap layer 22 is non-selectively removed, as shown in FIG. 1B, and then a silicide metal 105 such as Ni is deposited on the entire structure providing the structure shown in FIG. 1C. An optional oxygen diffusion barrier layer can be formed atop the silicide metal and then annealing is performed to cause reaction between the polySi and silicide metal. Depending on the metal, a low resistivity silicide can be formed utilizing a single anneal. After the single anneal, any unreacted metal and the optional oxygen diffusion barrier is removed, and if needed, a second anneal may be performed. FIG. 1D shows the structure after the salicide process in which silicided source/drain regions 100 and metal silicide gate 102 are formed. In this prior art process, gate and source/drain silicidation occurs simultaneously.

As shown, this prior art process forms thick metal silicide gates and thick source/drain silicides, each having a thickness of approximately 100 nm. This can be problematic for a few reasons. Firstly, the silicide can extend underneath the gate and short the device. Secondly, such a thick source/drain silicide can also be problematic given the recess of the isolation regions of the device caused by the non-selective removal of the cap layer from the gate. Specifically, the silicide in this prior art process can short across devices separated by narrow isolation regions. Thirdly, the thick silicide may consume the silicon in the extension regions under the spacers leading to poor device performance. Hence, methods that produce a thick and fully silicided metal gate and a much thinner source/drain silicide are needed. In addition, the silicide in this prior art process can also contact the implanted well regions of the device thereby shorting the device.

SUMMARY OF THE INVENTION

The present invention relates to an advanced gate structure that includes a fully silicided metal gate and silicided source and drain regions that abut the silicided metal gate. Specifically, and in broad terms, the present invention provides a semiconductor structure comprising a fully silicided metal gate of a first silicide metal having a first thickness and abutting silicided source and drain regions of a second metal having a second thickness, wherein said second thickness is less than the first thickness and said silicided source and drain regions are aligned to edges of a gate region including at least the fully silicided metal gate.

In accordance with the present invention, the thick fully silicided metal gate and the thinner silicided source and drain regions can be composed of the same or different metal silicide such as, for example, silicides of Ti, Ta, W, Co, Ni, Pt, Pd and alloys thereof. Of the various silicides, silicides of Co, Ni or Pt, in their lowest resistivty phase, are particularly preferred. In a highly preferred embodiment of the present invention, the source and drain regions include $CoSi_2$, while the silicided metal gate includes NiSi and/or NiPtSi. In another preferred embodiment of the present invention, the source and drain silicides comprise NiSi, while the silicided metal gate comprises NiSi and/or NtPtSi.

A metal oxide semiconductor (MOS) device is provided that comprises a semiconductor substrate having silicided source and drain regions located on a surface thereof, said silicided source and drain regions having a thickness of less than 500 Å and are self-aligned to an edge of a gate region that includes a fully silicided metal gate having a thickness of greater than 500 Å.

In addition to the structure described above, the present invention also provides methods for forming the advanced gate structure having the thick and fully silicided metal gate and the thinner silicided source and drain regions abutting the silicided metal gate. In one method of the present invention, the following processing steps are employed in fabricating the inventive structure:

providing a structure comprising at least one patterned gate stack and abutting source and drain regions, said at least one patterned gate stack including a polysilicon gate conductor, an overlying dielectric cap, a dielectric liner on at least sidewalls of said polysilicon gate conductor, and spacers on said dielectric liner and adjoining sidewalls of at least the polysilicon gate conductor;

depositing a material stack comprising a conformal dielectric layer and a planarizing dielectric layer on the structure including atop the at least one patterned gate stack;

removing portions of the conformal dielectric layer and planarizing dielectric layer to expose said dielectric cap;

removing the dielectric cap to expose the polysilicon gate conductor;

converting the polysilicon gate conductor into a fully silicided metal gate;

exposing said source and drain regions; and saliciding said source and drain regions to form silicided source and drain regions that have a thickness that is less than the fully silicided metal gate.

In some embodiments of the method described above, the silicided source/drain regions are formed prior to forming the material stack over the structure. In particular, when the silicided source/drain regions are formed before the silicide metal gate, they are formed after forming the spacer in the structure obtained in the providing step.

A second method of forming the inventive semiconductor structure is also provided. The second method employs a photoresist (negative-tone or positive-tone) and a dry etching process to selectively remove the dielectric cap. Specifically, and in broad terms, the second method of the present invention comprises the steps of:

providing a structure comprising at least one patterned gate stack and abutting source and drain regions, said at least one patterned gate stack including a polysilicon gate conductor, an overlying dielectric cap, and spacers on adjoining sidewalls of at least the polysilicon gate conductor;

forming a patterned photoresist atop the structure including said at least one patterned gate stack, said patterned photoresist containing an opening that exposes said dielectric cap;

selectively removing the dielectric cap utilizing a dry etching process to expose the polysilicon gate conductor;

removing the patterned photoresist;

converting the polysilicon gate conductor into a fully silicided metal gate; and saliciding said source and drain regions to form silicided source and drain regions that have a thickness that is less than the fully silicided metal gate.

In some embodiments of the second method described above, the silicided source/drain regions are formed prior to forming the photoresist over the structure. In particular, when the silicided source/drain regions are formed before the silicide metal gate, they are formed after forming the spacer in the structure obtained in the providing step. In the second embodiment of the present invention, the photoresist can be either a negative-tone photoresist or a positive-tone photoresist.

In some embodiments of the second method of the present invention, a lift-off layer is formed surrounding the gate regions and then the patterned photoresist is formed. After removing the dielectric cap, the patterned photoresist above the lift-off layer, together with the lift-off layer, are removed from the structure.

Another method of the present invention includes the use of a lithography level to provide precise alignment to the gate level. This third method of the present invention comprises:

providing a structure comprising at least one patterned gate stack and abutting source and drain regions, said at least one patterned gate stack including a polysilicon gate conductor, an overlying dielectric cap, and spacers on adjoining sidewalls of least the polysilicon gate conductor;

depositing a stack comprising a planarizing material, a masking layer and a photoresist on the structure including atop the at least one patterned gate stack;

patterning the stack to expose the dielectric cap;

selectively removing the dielectric cap utilizing a dry etching process to expose the polysilicon gate conductor;

removing the stack;

converting the polysilicon gate conductor into a fully silicided metal gate; and saliciding said source and drain regions to form silicided source and drain regions that have a thickness that is less than the fully silicided metal gate.

In some embodiments of the third method described above, the silicided source/drain regions are formed prior to forming the stack over the structure. In particular, when the silicided source/drain regions are formed before the silicide metal gate, they are formed after forming the spacer in the structure obtained in the providing step. A lift-off layer can also be used in the third method of the present invention. The lift-off layer is formed on the exposed surface of the patterned gate stack prior to patterning the stack of planarizing material, masking layer and photoresist.

DETAILED DESCRIPTION OF THE INVENTION

Figure 1A:
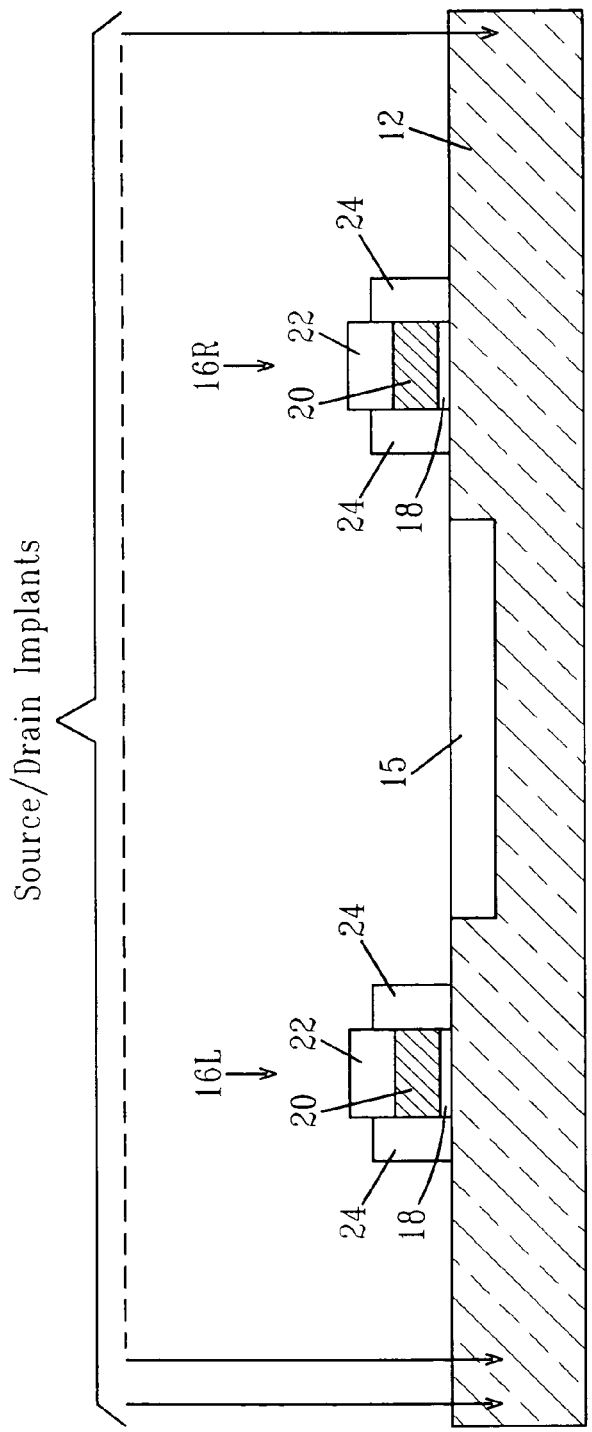
FIGS. 1A-1D are pictorial representations (through cross-sectional views) depicting a prior art process of fabricating self-aligned silicided metal gates from a polysilicon gate.
Figure 1B:
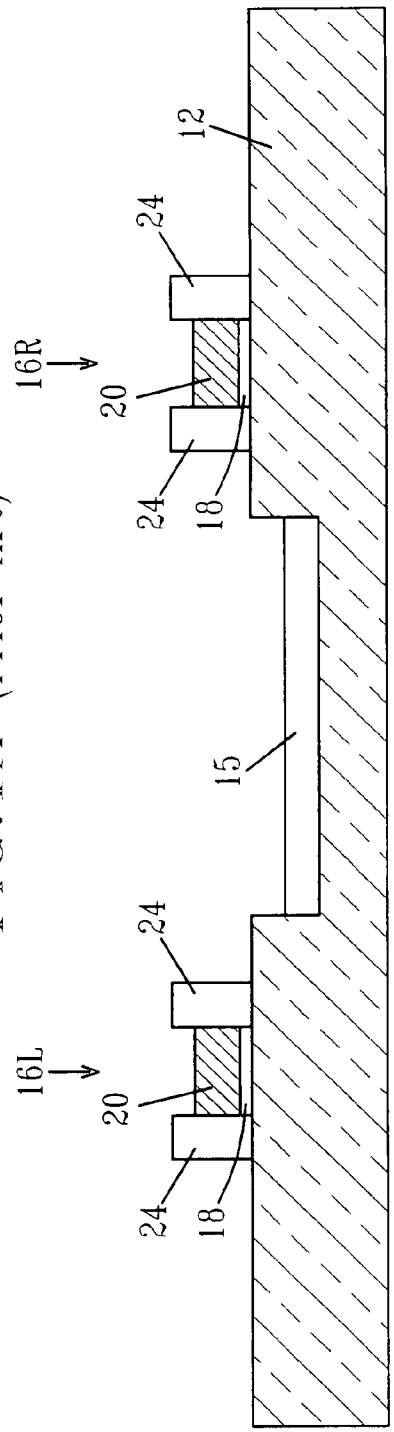
Figure 1C:
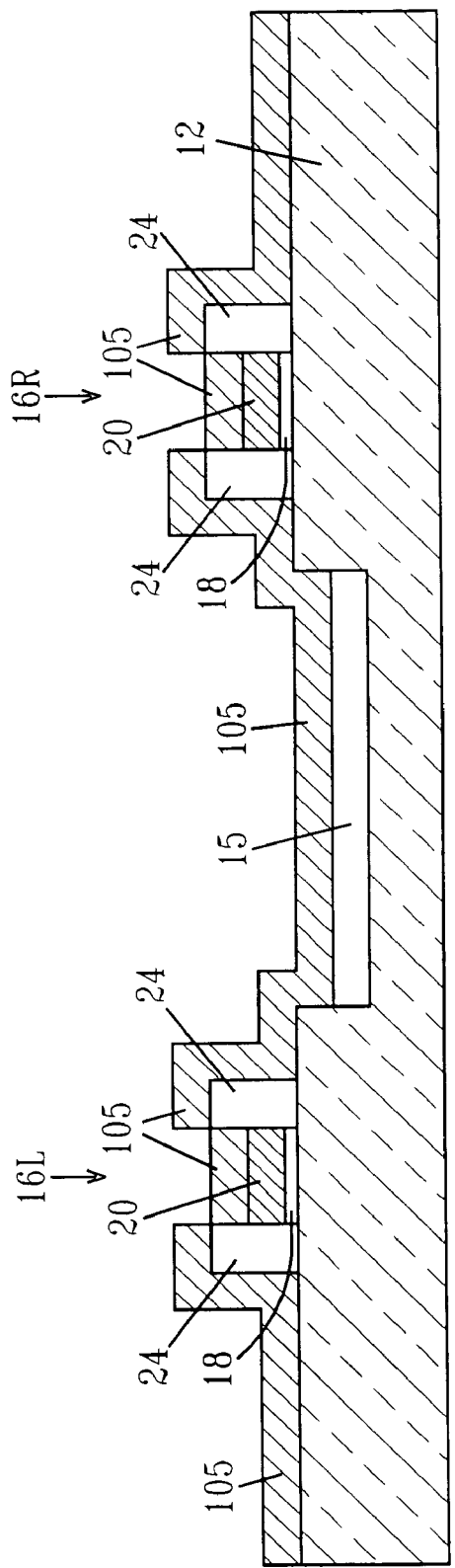
Figure 1D:
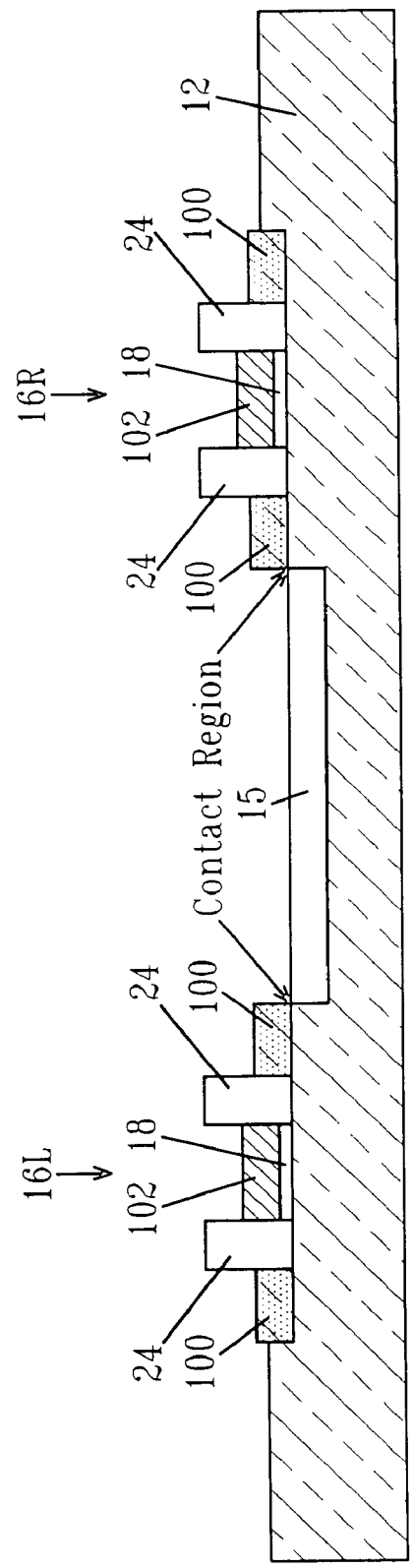

The present invention, which provides a MOS device that has a fully silicided gate and thin silicided source and drain regions (relative to the gate and prior art silicided source/drain regions) as well as methods of fabricating the same, will now be described in greater detail by referring to the drawings which accompany the present application. In the accompanying drawings, which are not drawn to scale, like and/or corresponding elements are referred to by like reference numerals.

It is noted that in the drawings two MOS device regions are shown to be formed atop a single semiconductor substrate. Although illustration is made to such an embodiment, the present invention is not limited to the formation of any specific number of MOS devices on the surface of the semiconductor structure. Instead, the method of the present invention forms at least one fully silicided MOS device on a surface of a semiconductor substrate.

Figure 2A:
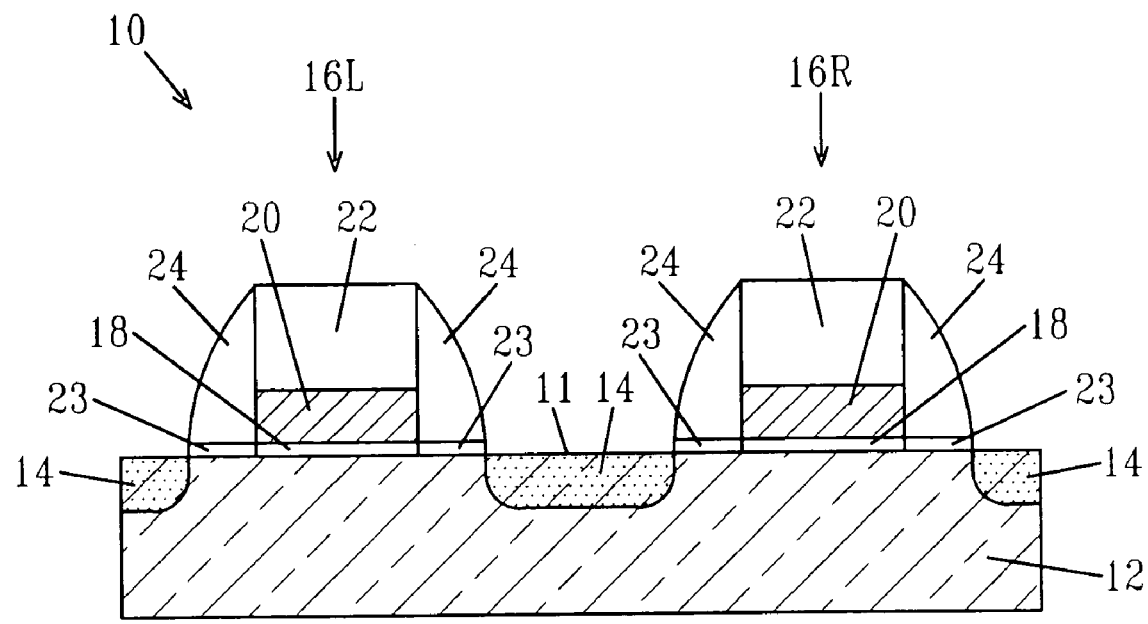
FIGS. 2A-2G are pictorial representations (through cross-sectional views) illustrating the basic processing steps employed in a first method of the present invention.

Reference is first made to structure 10 that is illustrated in FIG. 2A. Structure 10 includes a semiconductor substrate 12 that has two gate regions 16L and 16R, which are located on a surface of the semiconductor substrate 12. Each gate region, i.e., 16R and 16L, includes a gate dielectric 18, a polySi conductor 20, a dielectric cap 22, dielectric liner 23, spacers 24 and source/drain regions 14. The source/drain regions 14 are located within semiconductor substrate 12.

The semiconductor substrate 12 of structure 10 comprises any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

Trench isolation regions (not specifically shown) are typically already formed in the semiconductor substrate at this point of the present invention utilizing conventional processes well known to those skilled in the art. The trench isolation regions are located to the periphery of the region shown in the drawings of the present invention as well as between the two gate regions depicted.

A gate dielectric 18 is formed on the entire surface of the structure 10 including the semiconductor substrate 12 and atop the isolation region, if it is present and if it is a deposited dielectric. The gate dielectric 18 can be formed by a thermal growing process such as, for example, oxidation, nitridation or oxynitridation. Alternatively, the gate dielectric 18 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 18 may also be formed utilizing any combination of the above processes.

The gate dielectric 18 is comprised of an insulating material including, but not limited to: an oxide, nitride, oxynitride and/or silicate including metal silicates and nitrided metal silicates. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 18 may vary, but typically, the gate dielectric 18 has a thickness from about 0.5 to about 10 nm, with a thickness from about 0.5 to about 3 nm being more typical.

After forming the gate dielectric 18, a blanket layer of polysilicon (i.e., polySi) which becomes the polySi gate conductor 20 shown in FIG. 2A is formed on the gate dielectric 18 utilizing a known deposition process such as, for example, physical vapor deposition, CVD or evaporation. The blanket layer of polysilicon may be doped or undoped. If doped, an in-situ doping deposition process may be employed in forming the same. Alternatively, a doped polySi layer can be formed by deposition, ion implantation and annealing. The doping of the polySi layer will shift the workfunction of the silicided metal gate formed. Illustrative examples of dopant ions include As, P, B, Sb, Bi, In, Al, Ga, Tl or mixtures thereof. Typical doses for the ion implants are 1E14 (=$1\times10^{14}$) to 1E16 (=$1\times10^{16}$) atoms/cm$^2$ or more typically 1E15 to 5E15 atoms/cm$^2$. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

After deposition of the blanket layer of polysilicon, a dielectric cap 22 is formed atop the blanket layer of polysilicon gate conductor 20 utilizing a deposition process such as, for example, physical vapor deposition or chemical vapor deposition. The dielectric cap 22 may be an oxide, nitride, oxynitride or any combination thereof. The dielectric cap 22 can be comprised of a different dielectric material than spacer 24 to be defined in detail herein below. In one embodiment, a nitride such as, for example, $Si_3N_4$, is employed as the dielectric cap 22. In yet another embodiment, which is preferred, the dielectric cap 22 is an oxide such as $SiO_2$. The thickness, i.e., height, of the dielectric cap 22 is from about 20 to about 180 nm, with a thickness from about 30 to about 140 nm being more typical.

The blanket polysilicon layer and dielectric cap layer are then patterned by lithography and etching so as to provide patterned gate stacks. The patterned gate stacks may have the same dimension, i.e., length, or they can have variable dimensions to improve device performance. Each patterned gate stack at this point of the present invention includes a polySi gate conductor 20 and dielectric cap 22. The lithography step includes applying a photoresist to the upper surface of the dielectric cap layer, exposing the photoresist to a desired pattern of radiation and developing the exposed photoresist utilizing a conventional resist developer. The pattern in the photoresist is then transferred to the dielectric cap layer and the blanket layer of polysilicon utilizing one or more dry etching steps. In some embodiments, the patterned photoresist may be removed after the pattern has been transferred into the dielectric cap layer. In other embodiments, the patterned photoresist is removed after etching has been completed.

Suitable dry etching processes that can be used in the present invention in forming the patterned gate stacks include, but are not limited to: reactive ion etching, ion beam etching, plasma etching or laser ablation. The dry etching process employed is typically selective to the underlying gate dielectric 18 therefore this etching step does not typically remove the gate dielectric. In some embodiments, this etching step may however be used to remove portions of the gate dielectric 18 that are not protected by the gate stacks. A wet etching process can also be used to remove portions of the gate dielectric 18 that are not protected by the gate stacks.

Next, a dielectric liner 23 is formed on all exposed surfaces containing silicon including at least the polysilicon gate conductor 20. The dielectric liner 23 can also extend onto a horizontal surface of the semiconductor substrate 12, as is shown in FIG. 2A. The dielectric liner 23 may comprise any dielectric material that contains an oxide, nitride, oxynitride or any combination thereof. The dielectric liner 23 is formed via a thermal growing process such as oxidation, nitridation or oxynitridation. In accordance with the present invention, the dielectric liner 23 is a thin layer whose thickness is typically from about 1 to about 10 nm.

At least one spacer 24 is formed on exposed sidewalls of each patterned gate stack as well as atop the dielectric liner. The at least one spacer 24 is comprised of an insulator such as an oxide, nitride, oxynitride and/or any combination thereof and it typically is composed of a different material than the dielectric liner 23 and the dielectric cap 22. Preferably, nitride spacers are formed. The at least one spacer 24 is formed by deposition and etching. Note that the etching step used in forming the spacers 24 also can remove dielectric liner 23 from atop the substrate such that a portion of the semiconductor substrate 12 is exposed. The exposed portion of the semiconductor substrate 12 is labeled as reference numeral 11 in FIG. 2A.

The width of the at least one spacer 24 must be sufficiently wide enough such that the source and drain silicide contacts (to be subsequently formed) do not encroach underneath the edges of the gate stack. Typically, the source/drain silicide does not encroach underneath the edges of the gate stack when the at least one spacer has a width, as measured at the bottom, from about 15 to about 80 nm.

After spacer formation, source/drain diffusion regions 14 are formed into the substrate 12 at the exposed portion 11. The source/drain diffusion regions 14 are formed utilizing ion implantation and an annealing step. The annealing step serves to activate the dopants that were implanted by the previous implant step. The conditions for the ion implantation and annealing are well known to those skilled in the art.

Figure 2B:
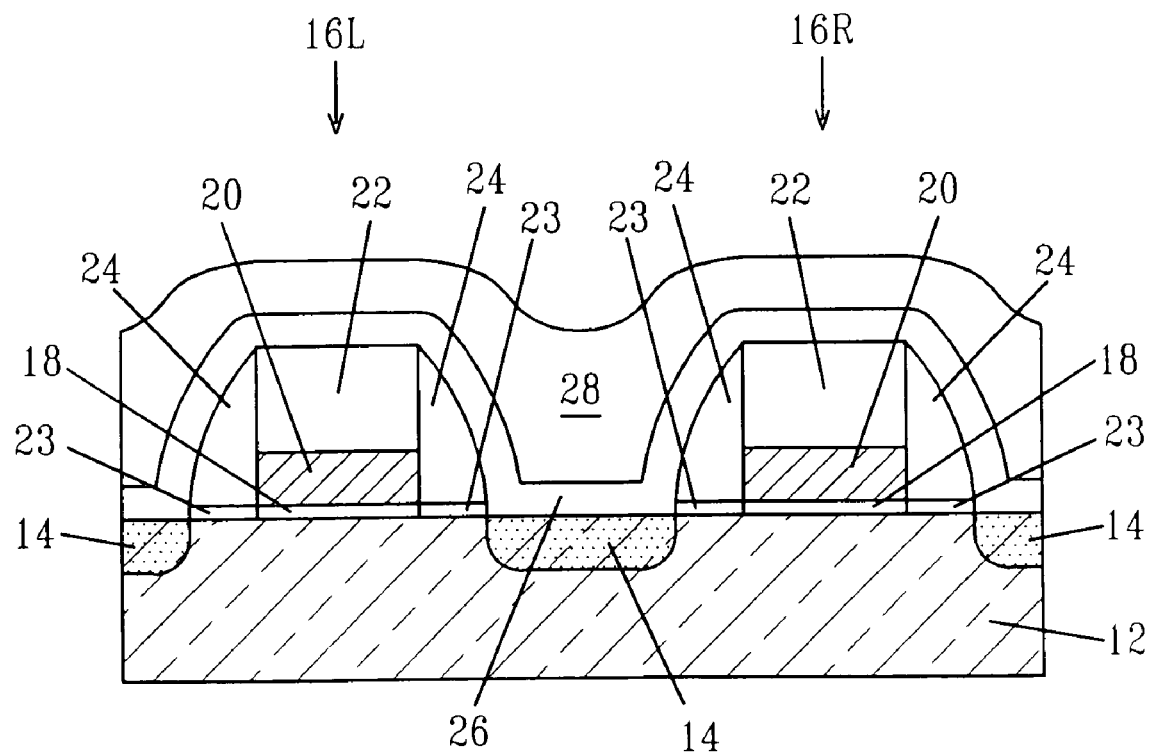

Next, and as shown in FIG. 2B, a material stack comprising a conformal dielectric layer 26 and a planarizing dielectric 28 is formed over the entire structure shown in FIG. 2A. In accordance with the present invention, the conformal dielectric layer 26 is formed first followed by the planarizing dielectric layer 28. The conformal dielectric layer 26 comprises any dielectric material including an oxide, nitride, and/or oxynitride. Specifically, the conformal dielectric layer 26 comprises a nitride such as $Si_3N_4$. The conformal dielectric layer, which is formed utilizing a conventional deposition process, has a thickness after deposition from about 15 to about 80 nm.

After forming the conformal dielectric layer 26 over the structure shown in FIG. 2A, the planarizing dielectric layer 28 is formed. The planarizing dielectric layer 28 comprises an oxide such as a high density oxide or an oxide deposited from TEOS. Alternatively, the planarizing dielectric layer 28 may comprise a doped silicate glass, such as boron doped silicate glass (BSG) or phosphorus doped silicate glass (PSG), a spin-coatable polymeric material such as hydrogen silsesquioxane (HSQ), or a photoresist. The planarizing dielectric layer 28 is formed by conventional techniques well known to those skilled in the art. The thickness of the planarizing dielectric layer 28 formed at this point of the present invention may vary depending on the type of material employed. Typically, the planarizing dielectric layer 28 has a thickness from about 50 to about 100 nm. In accordance with the present invention, the planarizing layer atop the gate stacks is less than the thickness of the same over the source/drain regions and the trench isolation regions.

Figure 2C:
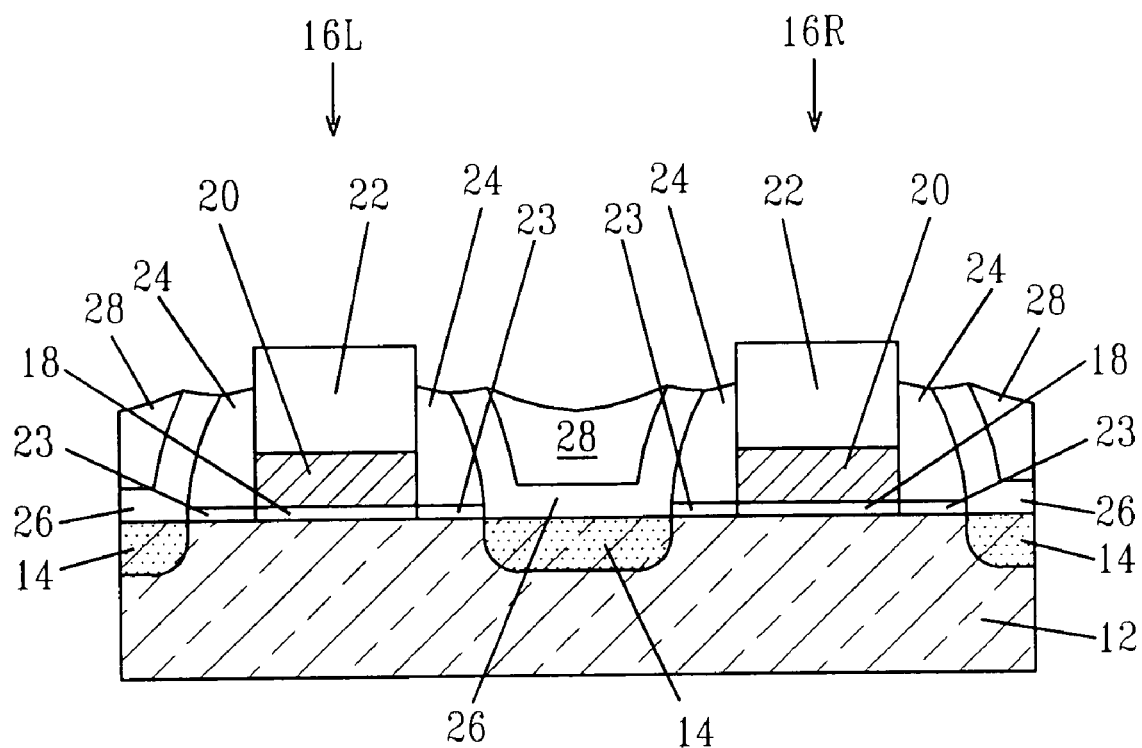
Figure 2D:
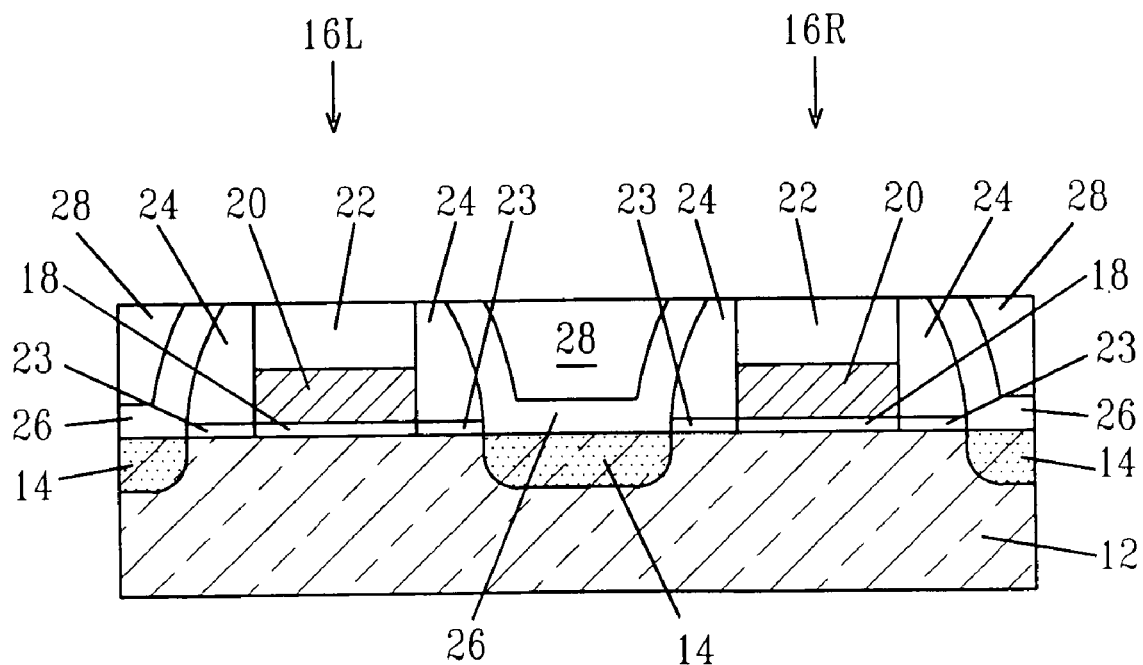

FIGS. 2C and 2D represent various embodiments that can be employed in the present invention to expose dielectric cap 22. FIG. 2C shows an embodiment in which an etch back process is employed, while FIG. 2D shows an embodiment in which a chemical mechanical polishing (CMP) process is employed. The etch back process comprises at least one timed etching process that can selectively remove portions of both the planarizing dielectric layer 28 and the conformal dielectric layer 26 which extend above an upper surface of the dielectric cap 22. In some embodiments, a portion of the planarizing dielectric layer 28 is first etched back and then a portion of the conformal dielectric layer 26 is etched back using different etching processes. An example of an etching process that can be used in forming the structure shown in FIG. 2C comprises a dry etch process that first etches oxide selective to nitride followed by a dry etch process that etches nitride selective to oxide. The CMP process used in forming the structure shown in FIG. 2D is conventional and well known to those skilled in the art.

Notwithstanding which technique (e.g., etch back or CMP) is employed, the resultant structure after etching back or CMP has the dielectric cap 22 exposed. Although both embodiments can be used in the present invention, the following drawings illustrate the structure which has been subjected to the etch back process. It is noted that the structure that has been planarized by CMP can also undergo the following processes.

Figure 2E:
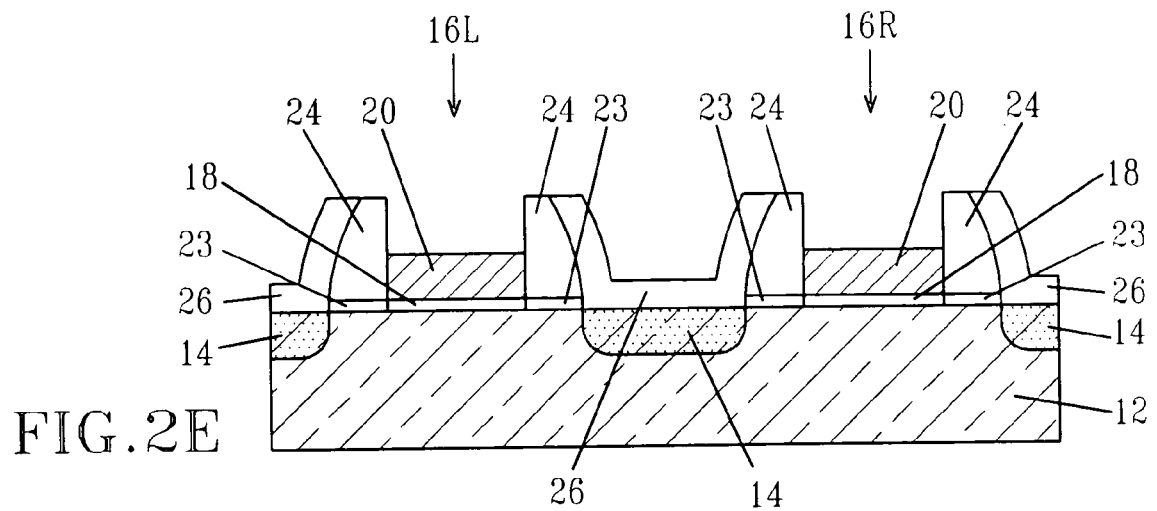

The exposed dielectric cap 22 is removed from each gate region 16L and 16R so that the underlying polysilicon gate conductor 20 is exposed. The resultant structure that is formed after this step has been performed is shown, for example, in FIG. 2E. The dielectric cap 22 is removed in the present invention by utilizing an etching process, wet or dry, which removes the dielectric cap material from the structure. Although a dry etching process such as reactive-ion etching (RIE), ion beam etching (IBE), and plasma etching can be employed, it is preferred that a wet etch process be employed in removing the dielectric cap 22. An example of a wet etch process that can be used to remove the dielectric cap 22 includes dilute hydrofluoric acid (DHF). In embodiments in which the dielectric cap 22 and the planarizing dielectric layer 28 are composed of oxides, this step also removes the remaining planarizing dielectric layer 28 between the gate regions. This is shown in FIG. 2E as well. In this instance, the remaining portion of the conformal dielectric layer 26 protects the portion of the substrate containing the source/drain regions 14.

After etching the cap dielectric 22 from atop the polySi gate conductor 20, a first salicide process is performed to consume the polySi gate conductor 20 forming fully silicided metal gates 30. The first salicide process is exemplified in FIG. 2F. The first step of the first salicide process includes depositing a blanket silicide metal atop the structure shown in FIG. 2E. The silicide metal can be deposited using any conventional deposition process including, for example, sputtering, chemical vapor deposition, evaporation, chemical solution deposition, plating and the like. The silicide metal can be the same or different than the metal used in forming the silicided source/drain regions (to be subsequently formed and described).

The silicide metal can be composed of at least one of Ti, Hf, Ta, W, Co, Ni, Pt, Pd or alloys thereof. In one embodiment, the silicide metal is Co; $CoSi_2$ forms using a two step annealing process. In another embodiment of the present invention, the silicide metal is Ni or Pt; NiSi and PtSi form using a single annealing step.

The silicide metal thickness is selected so as to form the silicide phase with the appropriate workfunction for the particular MOS device and to consume all of the polySi gate conductor 20. For example, NiSi has a workfunction of 4.65 eV, and if the initial polysilicon height is 50 nm, the amount of Ni needed is about 27 nm. $CoSi_2$ has a workfunction of 4.45 eV, and if the initial polysilicon height is 50 nm, the amount of Co needed is about 14 nm. Although the silicide metal thicknesses given are the amount necessary to just consume the polysilicon, it is preferred if the thickness were in excess by about 10% to make sure consumption is complete.

In some embodiments (not shown), an oxygen diffusion barrier such as TiN or W is formed atop the silicide metal prior to annealing.

Specifically, the salicide annealing includes a first anneal which is employed to form a first silicide phase in the structure; the first silicide phase may or may not represent the lowest resistivity phase of a metal silicide. The first anneal is typically performed at lower temperatures than the second annealing step. Typically, the first annealing step, which may, or may not, form a high resistance silicide phase material, is performed at a temperature from about 300° to about 600° C.

using a continuous heating regime or various ramp and soak heating cycles. More preferably, the first annealing step is performed at a temperature from about 350° to about 550° C.

The salicide anneals (first and second) are carried out in a gas atmosphere, e.g., He, Ar, $N_2$ or forming gas. The gate silicide annealing steps may use different atmospheres or the annealing steps may be carried out in the same atmosphere. For example, He may be used in both annealing steps, or He can be used in the first annealing step and a forming gas may be used in the second annealing step.

Next, a selective wet etch step is employed to remove any non-reactive silicide metal from the structure. For some metal silicides, the salicide process may be stopped at this point since the polysilicon is consumed and the resistivity of the first silicide phase is close to minimum values for the phase. This is in the case for Ni and Pt. In other cases, for example when Co or Ti are used as the silicide metal, a second higher temperature anneal is needed for the consumption of the remaining polysilicon and forming a second silicide phase material. In this embodiment, the first silicide phase is a high resistivity phase silicide material, while the second silicide phase material is a lower resistivity phase silicide material.

The second annealing step is performed at a temperature from about 600° C. to about 800° C. using a continuous heating regime or various ramp and soak heating cycles. More preferably, the second annealing step is performed at a temperature from about 650° C. to about 750° C.

Figure 2F:
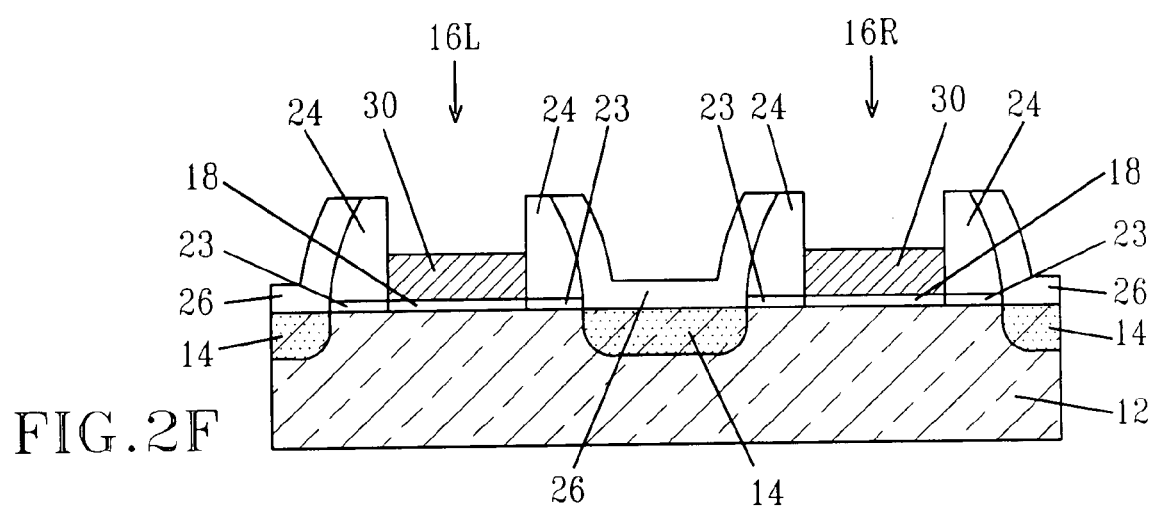

FIG. 2F shows the structure after formation of fully silicided metal gates 30. The fully silicided metal gates 30 are located atop the gate dielectric 18 between spacers 24 in an area previously occupied by the polySi gate conductor 20.

In some embodiments of the present invention and if not previously done, the remaining portions of the planarizing dielectric layer 28 between the gate regions is removed utilizing a selective etching process. The remaining portions of the conformal dielectric layer 26 between each gate region is then removed utilizing an etching process that selectively etches the conformal dielectric material from the structure. This step of the present invention exposes the portion of the substrate 12 containing source/drain regions 14.

Figure 2G:
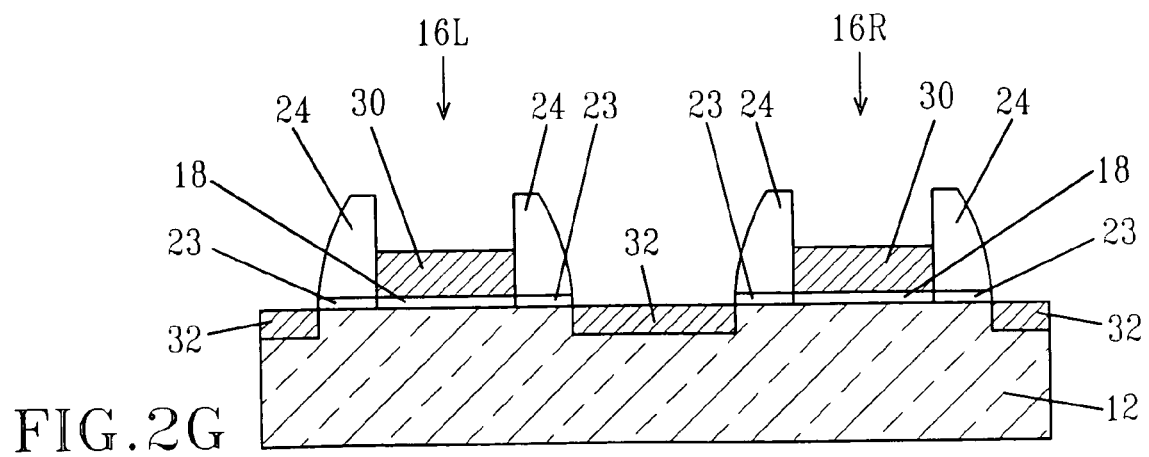

Source and drain silicide contacts 32 (hereinafter source/drain silicides) are then formed using a salicide process which includes the steps of depositing a silicide metal on an exposed surface of the substrate 12 that includes the source/drain diffusion regions 11, optionally depositing an oxygen diffusion barrier material such as TiN on the silicide metal, first annealing to form a silicide, selective etching any non-reacted metal including barrier material if used and, if needed, performing a second annealing step. The step of the present invention is shown in FIG. 2G.

When the semiconductor substrate does not comprise silicon, a layer of silicon (not shown) can be grown atop the exposed surface of the semiconductor substrate 12 and can be used in forming the source/drain silicide contacts.

The silicide metal used in forming the source/drain silicides 32 comprises any metal that is capable of reacting with silicon to form a metal silicide. If the substrate does not include silicon, then the metal silicide needs to comprise a metal that will form a silicide with other substrate materials, e.g., Ni for a SiGe surface. Examples of such metals include, but are not limited to: Ti, Ta, W, Co, Ni, Pt, Pd and alloys thereof. In one embodiment, Co is a preferred metal. In such an embodiment, the second annealing step is required. In another embodiment, Ni or Pt is preferred. In this embodiment, the second annealing step is typically not performed.

The silicided source/drain regions 32 can be formed utilizing the conditions described above in forming the silicided gate. The source/drain silicides, i.e., silicided source/drain regions, 32, which are formed utilizing the above-mentioned process, are self-aligned to edges of the gate region 16R or 16L. In particular, the outer edges of the silicided source/drain regions 32 are aligned with edges of the dielectric liner 23 and spacer 24. The silicided source/drain regions 32 have a thickness (measured vertically) of less than 50 nm, with a thickness from about 15 to about 30 nm being more typical.

In the process of the present invention, the silicided metal used in forming the silicided source/drain regions and the silicided metal gate may include an alloying additive that can enhance the formation of the metal silicide. Examples of alloying additives that can be employed in the present invention include, but are not limited to: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the material used in forming the silicide. When present, the alloying additive is present in an amount from about 0.1 to about 50 atomic percent. The alloying additive may be introduced as a dopant material to the silicide metal layer or it can be a layer that is formed atop the silicide metal layer prior to annealing.

It should be noted that although the above describes an initial structure that does not include raised source/drain regions, the present invention also contemplates the presence of raised source/drain regions in the initial structure. The raised source/drain regions are formed utilizing conventional techniques well known to those skilled in the art. Specifically, the raised source/drain regions are formed by depositing any Si-containing layer, such as epi Si, amorphous Si, SiGe, and the like, atop the substrate prior to implanting the source/drain regions.

In addition to the embodiment described above in which the silicided source/drain regions are formed after the silicided metal gate, the present invention also contemplates an embodiment in which the silicided source/drain regions are formed prior to the silicided metal gate. In such an embodiment, the silicided source/drain regions can be formed after spacer 24 formation, prior to forming conformal dielectric layer 26 over the structure.

Reference is now made to FIGS. 3A-3E which show a second method of the present invention. In this second method a photoresist (negative-tone or positive-tone) and dry etching are employed to remove the dielectric cap 22 that lies atop the polysilicon gate conductor 20. Specifically, the second method begins with first providing the structure 50 shown in FIG. 3A. The structure 50 is similar to the structure 10 shown in FIG. 2A except that no dielectric liner 23 is present. Although, no dielectric liner 23 is shown, the present invention contemplates an embodiment in which the same is present. The structure 50 shown in FIG. 3A comprises substrate 12 that has two gate regions 16L and 16R, which are located on a surface of the semiconductor substrate 12. Each gate region, i.e., 16R and 16L, includes a gate dielectric 18, a polySi gate conductor 20, a dielectric cap 22, spacers 24 and source/drain regions 14. The source/drain regions 14 are located within semiconductor substrate 12.

Figure 3A:
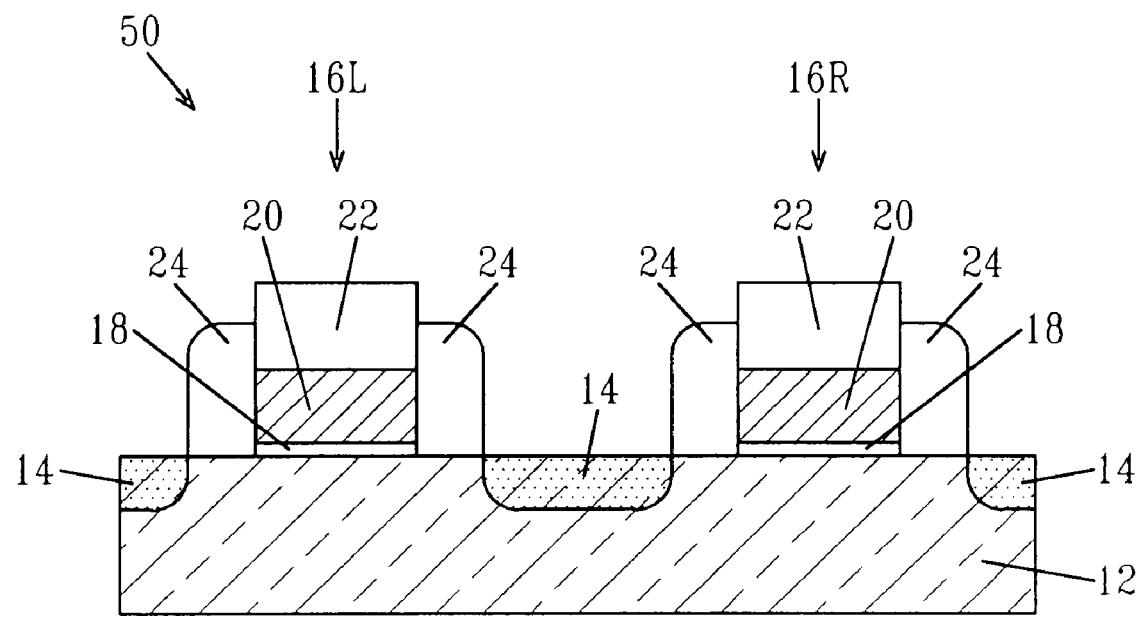
FIGS. 3A-3E are pictorial representations (through cross-sectional views) illustrating the basic processing steps employed in a second method of the present invention.

The initial structure shown in FIG. 3A is fabricated using the techniques described above in the first embodiment for fabricating structure 10 shown in FIG. 2A.

Figure 3B:
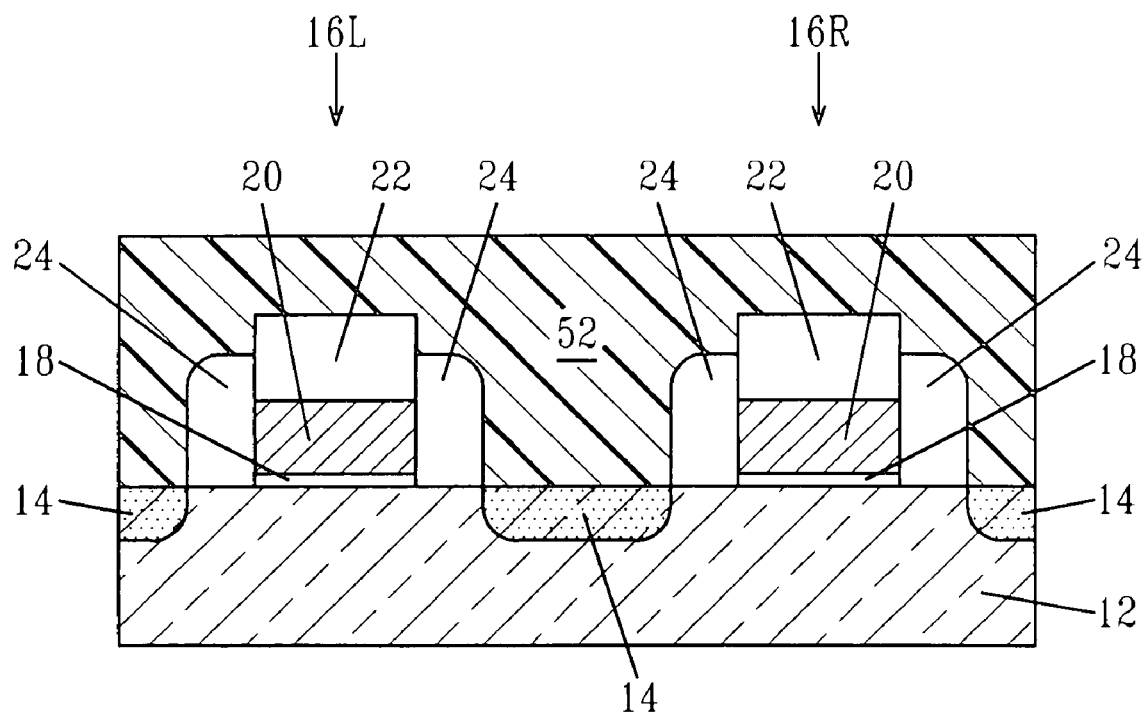

In accordance with the second embodiment of the present invention, a negative-tone photoresist (or alternatively a positive-tone photoresist) 52 is then formed over the entire structure providing the structure shown in FIG. 3B. The term "negative-tone photoresist" denotes a photoresist that remains in areas that were not protected from exposure by opaque regions of a mask, while being removed by the developer in regions that were protected. Hence, the unexposed regions of the photoresist remain after development and thus the negative image of a mask remains. The negative-tone photoresist 52 employed in the present invention thus includes any photoresist material which when exposed to light changes from a soluble condition to an insoluble condition. Such negative-tone resists are conventional and well known to those skilled in the art.

In addition to negative-tone photoresists, the present invention also contemplates using positive-tone photoresists. The difference in using a positive-tone photoresist, as compared to a negative-tone photoresist, is that the exposed positive-tone photoresist becomes soluble when exposed to radiation. Hence, the exposed areas are developed and are removed. Such positive-tone photoresists are also well known to those skilled in the art. The use of the positive-tone photoresist does not alter the processing steps described below. The specific type of photoresist employed is dependent upon the polarity of the mask used, as is well known to those skilled in the art.

The photoresist 52 is applied to the structure shown in FIG. 3A using a conventional deposition process such as spin-on coating that is well known to those skilled in the art. The thickness of the applied photoresist 52 may vary so long as the upper surface thereof is above the upper surface of the dielectric cap 22.

Figure 3C:
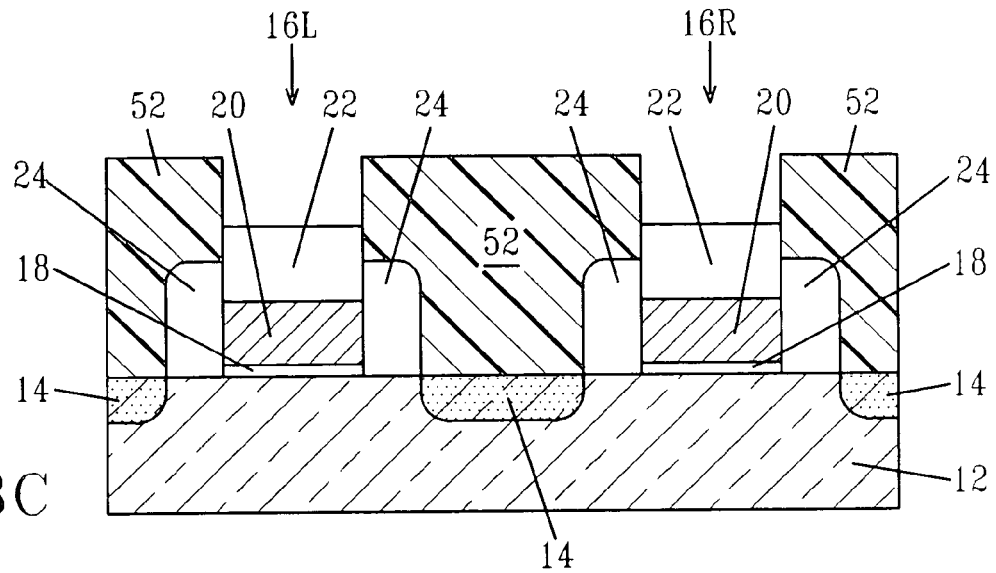

FIG. 3C shows the structure after exposing the photoresist to radiation and developing the areas of the photoresist 52 that are above each gate region 16L and 16R. The exposure and developing process include conventional lithography techniques that are well known to those skilled in the art. Note that in this structure the upper surface of each dielectric cap 22 atop the polySi gate conductor 20 is exposed.

Figure 3D:
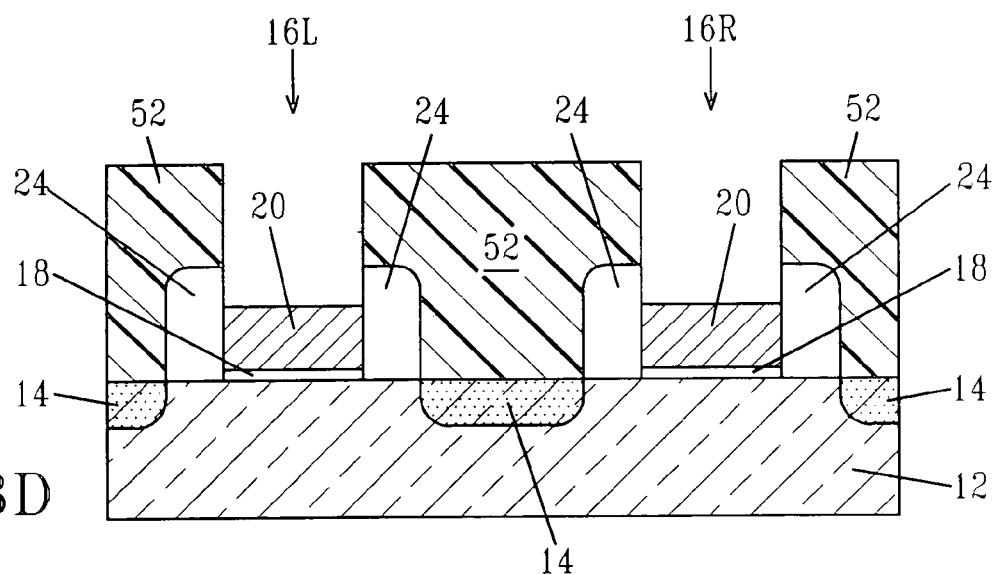

Next, and as shown in FIG. 3D, the dielectric cap 22 is removed from the structure so that the underlying polySi gate conductor 20 is exposed. In accordance with this embodiment of the present invention, the dielectric cap 22 is removed utilizing a dry etching process that selectively removes the dielectric cap as compared to the photoresist. For example, reactive ion etching, or laser beam etching ion beam etching can be used to selectively remove the dielectric cap 22.

Figure 3E:
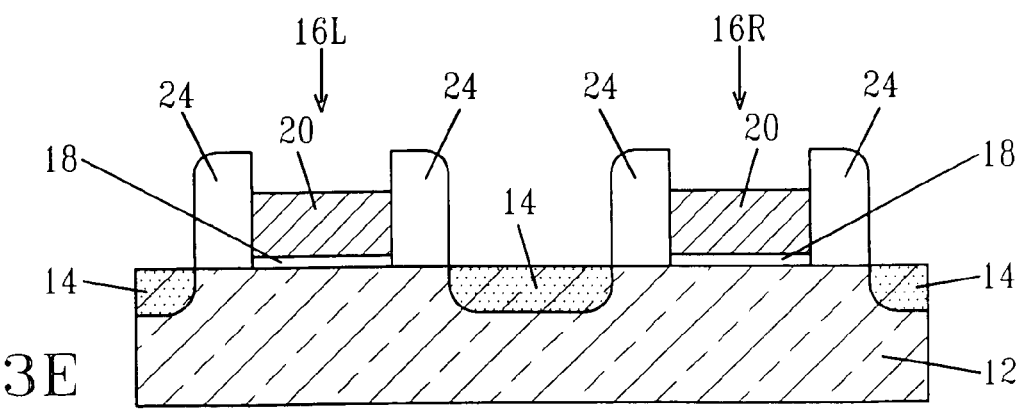

Following the removal of the dielectric cap 22, the remaining photoresist 52 is removed from the structure providing the structure illustrated in FIG. 3E. The processing described above in forming the silicided metal gates and silicided source/drain regions is then performed. The resultant structure is similar to the one depicted in FIG. 2G except that the dielectric liner 23 is not necessarily present.

In addition, the second embodiment also contemplates the case when the silicided source/drain regions are formed prior to formation of the photoresist (negative-tone or positive-tone).

Reference is now made to FIGS. 4A-4D, which are pictorial representations illustrating a embodiment of the second method of the present invention in which a photoresist is used with a lift-off layer. This method of the present invention begins by providing the structure 60 shown in FIG. 4A. This structure includes substrate 12 that has two gate regions 16L and 16R, which are located on a surface of the semiconductor substrate 12. Each gate region, i.e., 16R and 16L, includes a gate dielectric 18, a polySi gate conductor 20, a dielectric cap 22, spacers 24 and source/drain regions 14. The source/drain regions 14 are located within semiconductor substrate 12. A photoresist (either negative-tone or positive-tone) 52 is located atop the substrate 12 and the gate regions 16L and 16R. A lift-off layer 62 surrounds the gate regions 16L and 16R.

Specifically, the lift-off layer 62 is located around the gate stacks and beneath the photoresist. The lift-off layer 62 is a weakly adhering layer that is capable of detaching from the substrate in a chemical solvent. As known to those skilled in the art, the materials above the lift-off layer are removed. Specifically, in the present invention, once the dielectric gap is removed, the silicide metal is deposited on the exposed polySi gate conductor and thereafter the remaining lift-off layer and photoresist are removed.

Figure 4A:
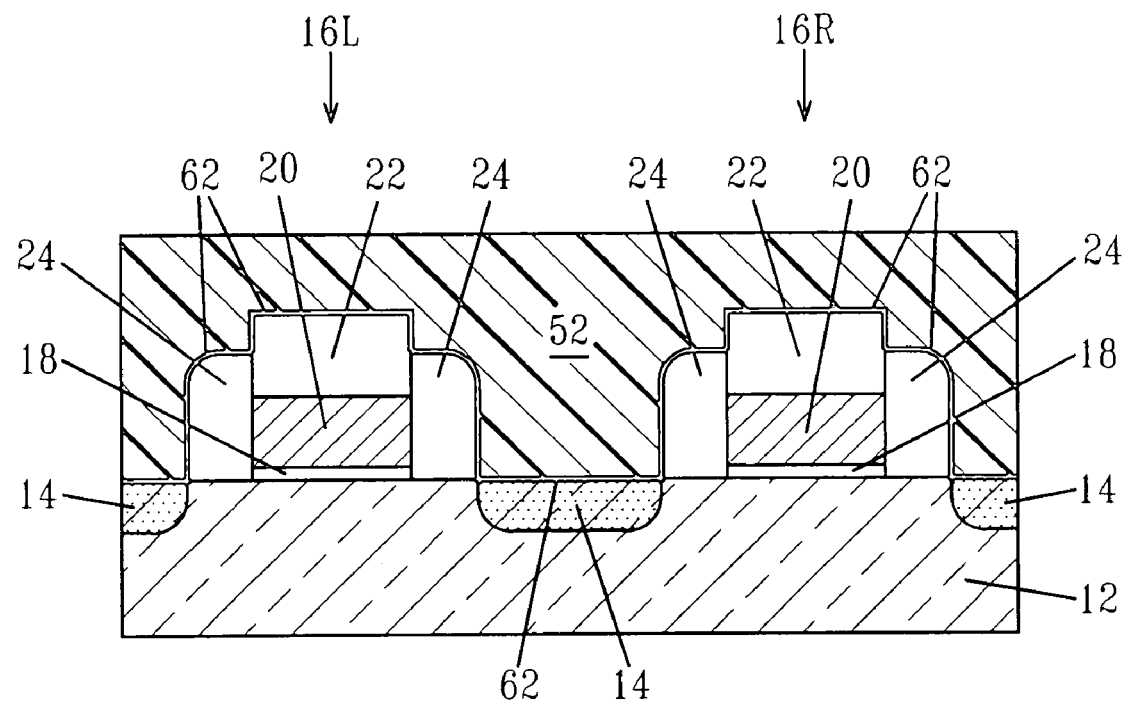
FIGS. 4A-4D are pictorial representations (through cross-sectional views) illustrating an embodiment of the second method of the present invention in which a photoresist is used with a lift-off layer.
Figure 4B:
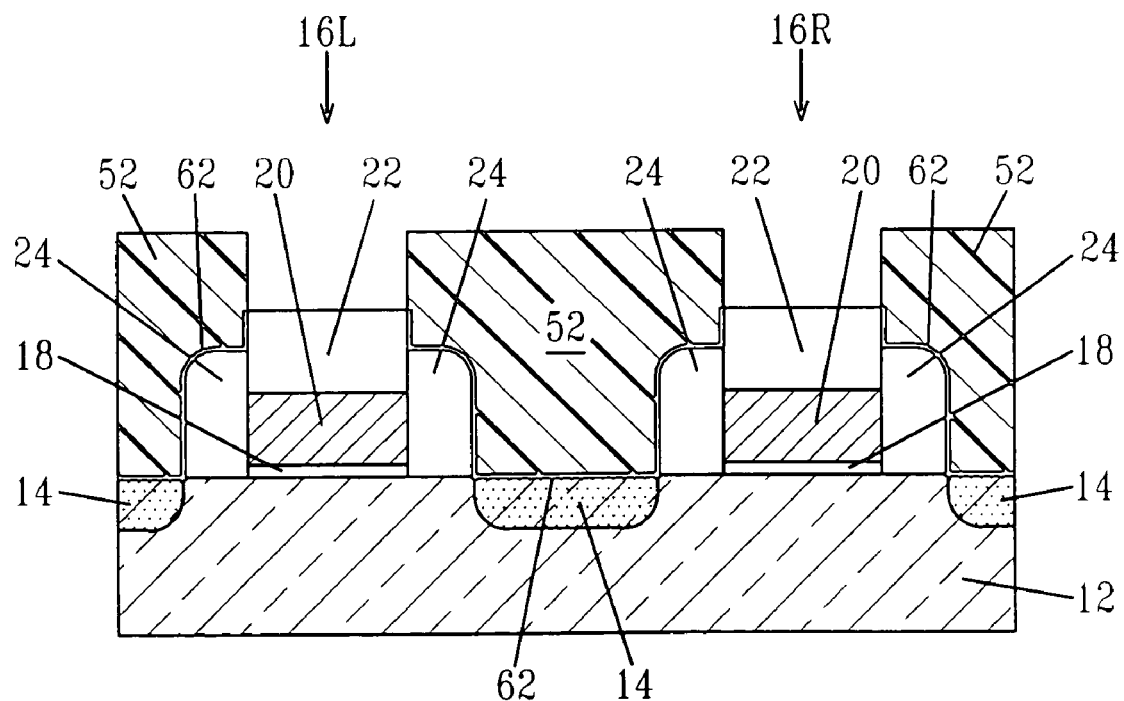
Figure 4C:
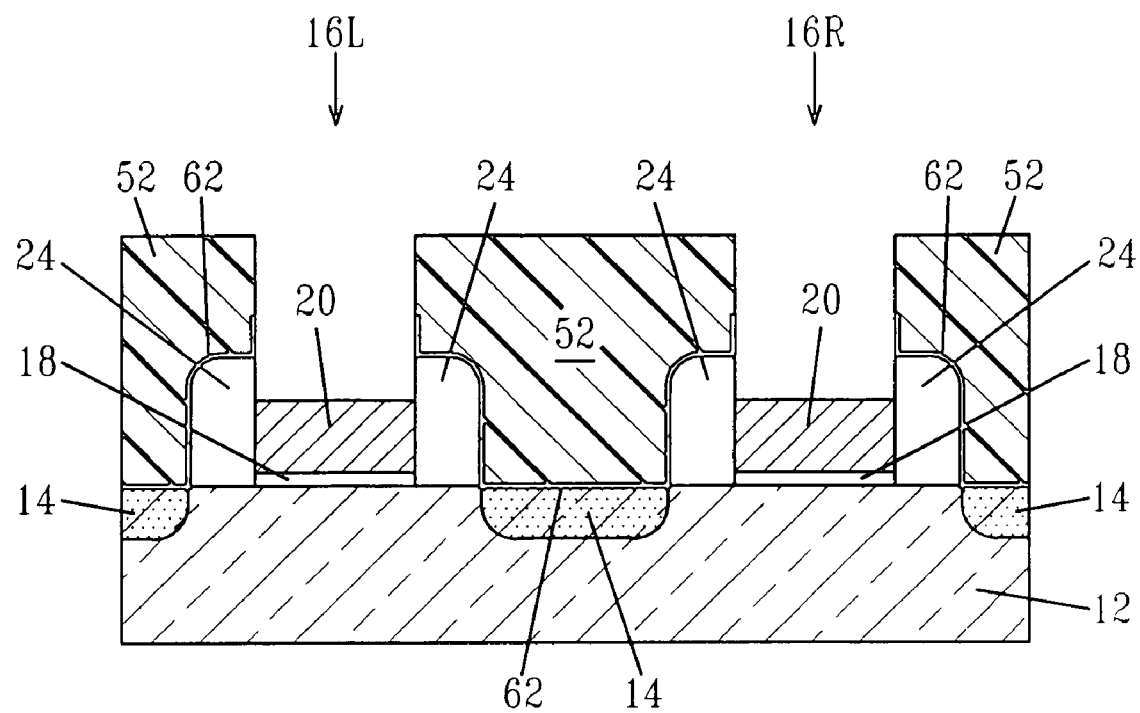

The initial structure shown in FIG. 4A is fabricated using the techniques described above in the first embodiment for fabricating structure 10 shown in FIG. 2A as well as the processing techniques described in connection with fabricating the structure shown in FIG. 3B. A difference in the structure shown in FIG. 4A is that a lift-off layer 62 is formed surrounding each gate stack prior to applying the photoresist. The lift-off layer 62 is formed utilizing known deposition processes such as a spin-on process. The thickness of the lift-off layer 62 may vary depending on the material employed as well as the thickness of photoresist 52. Typically, the lift-off layer 62 has a thickness from about 50 to about 200 nm, with a thickness from about 100 to about 150 nm being more typical. Common lift-off materials are known to those skilled in the art.

Photoresist 52 is then applied and the photoresist 52 is thereafter exposed and developed as described above in the second method providing openings that expose the lift-off layer 62 that is located on the upper surface layer of each dielectric cap 22. After exposing the lift-off layer 62 on each gate region, the exposed lift-off layer 62 is removed exposing an underlying surface of the dielectric cap 22. See FIG. 4B. The exposed dielectric cap 22 is then removed from the structure utilizing the dry etching process described in the second method of the present invention that selectively removes the dielectric cap 22 as compared to the photoresist 52. The structure is shown, for example, in FIG. 4C.

Figure 4D:
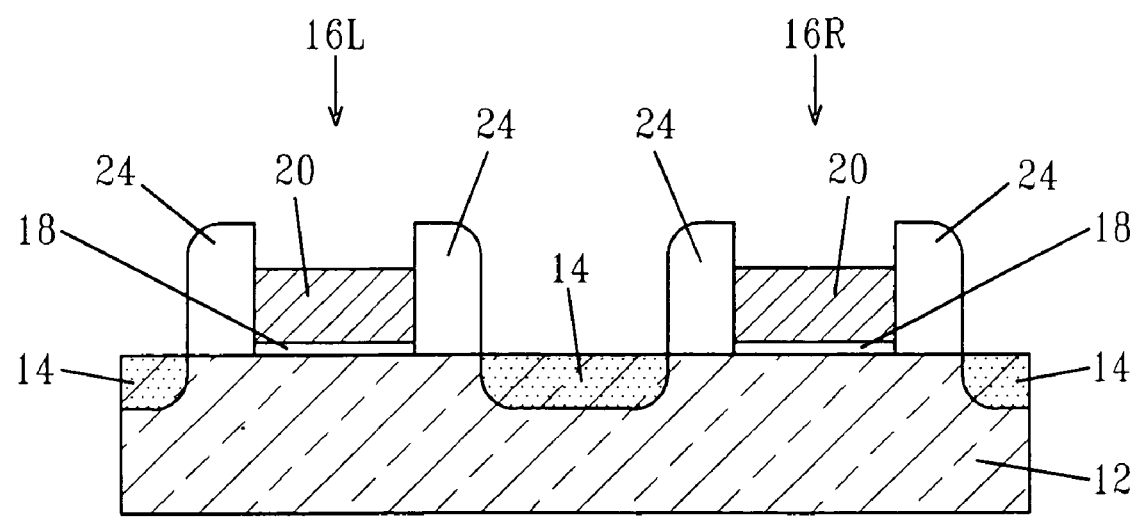

Next, and as shown in FIG. 4D, the photoresist 52 is removed from the structure utilizing a conventional lift-off process that is well known in the art. For example, the lift-off process may include a wet etch process that detaches the remaining lift-off layer 62 not previously removed. Processing as described above, i.e., silicidation of the gate, now takes place. Alternatively, the metal silicide can be formed on the exposed polySi gate conductor prior to the lift-off procedure. This avoids the need of utilizing a selective wet etch process during the silicidation step since no metal silicide is present on other areas of the structure besides the polySi gate conductor. There is no need to silicide prior to lift-off because after the lift-off process the silicide metal is only present on top of the polySi gate.

The silicided source and drain regions can be formed prior to forming the lift-off layer 62 and the photoresist 52 on the structure or after silicide metal gate formation.

Figure 5A:
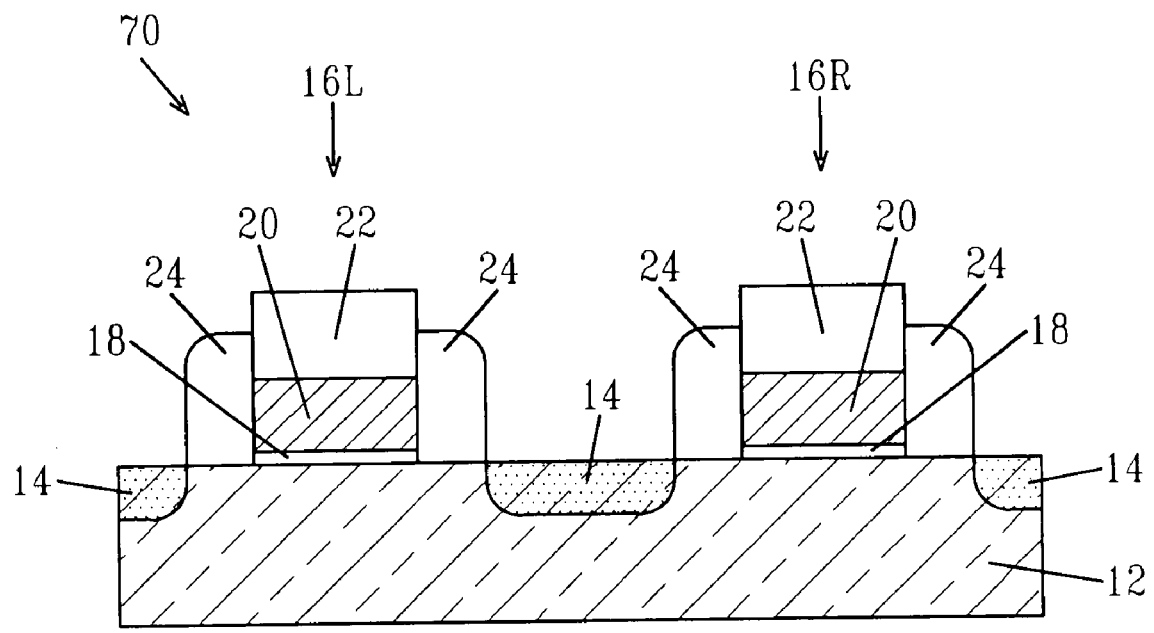
FIGS. 5A-5I are pictorial representations (through cross-sectional views) illustrating a third method of the present invention in which a lithography level is used to provide precise alignment to the gate level.

A third method of the present invention is shown in FIGS. 5A-5I. In this preferred method of the present invention, a lithography level is used to provide precise alignment to the gate level. FIG. 5A shows an initial structure 70 that is employed in this embodiment of the present invention. Initial structure 70 includes substrate 12 that has two gate regions 16L and 16R, which are located on a surface of the semiconductor substrate 12. Each gate region, i.e., 16R and 16L, includes a gate dielectric 18, a polySi gate conductor 20, a dielectric cap 22, spacers 24 and source/drain regions 14. The source/drain regions 14 are located within semiconductor substrate 12. The initial structure shown in FIG. 5A is fabricated using the techniques described above in the first method for fabricating structure 10 shown in FIG. 2A except that the dielectric liner 23 is not present.

Figure 5B:
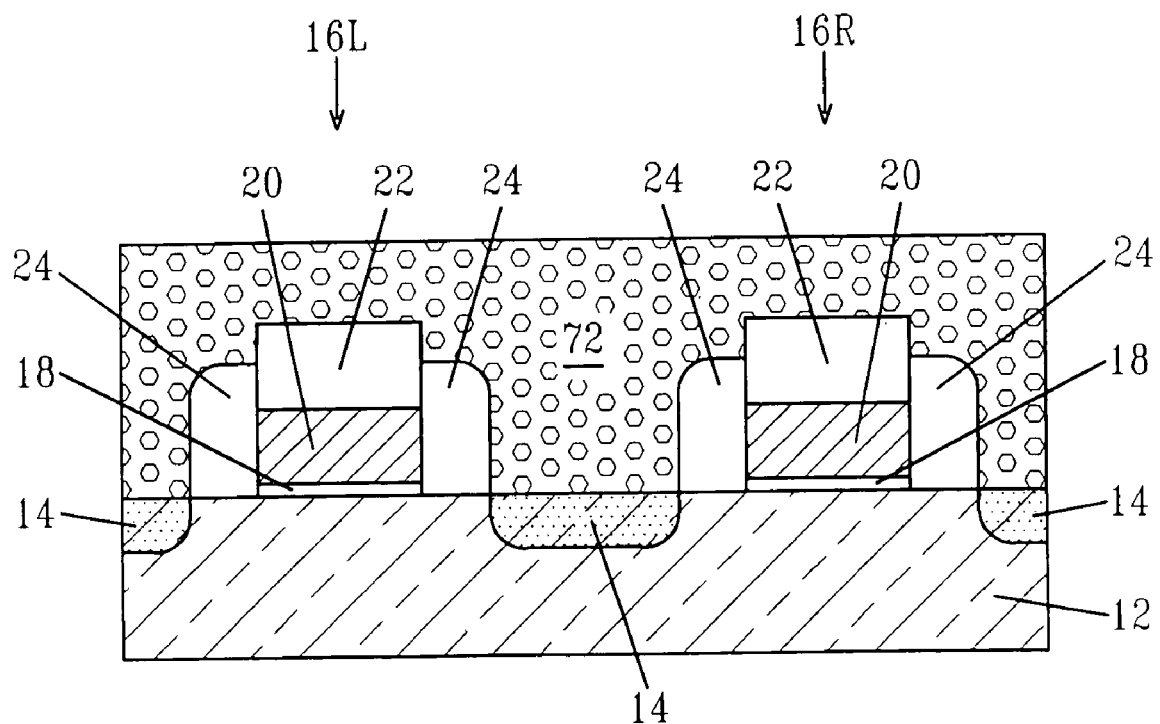
Figure 5C:
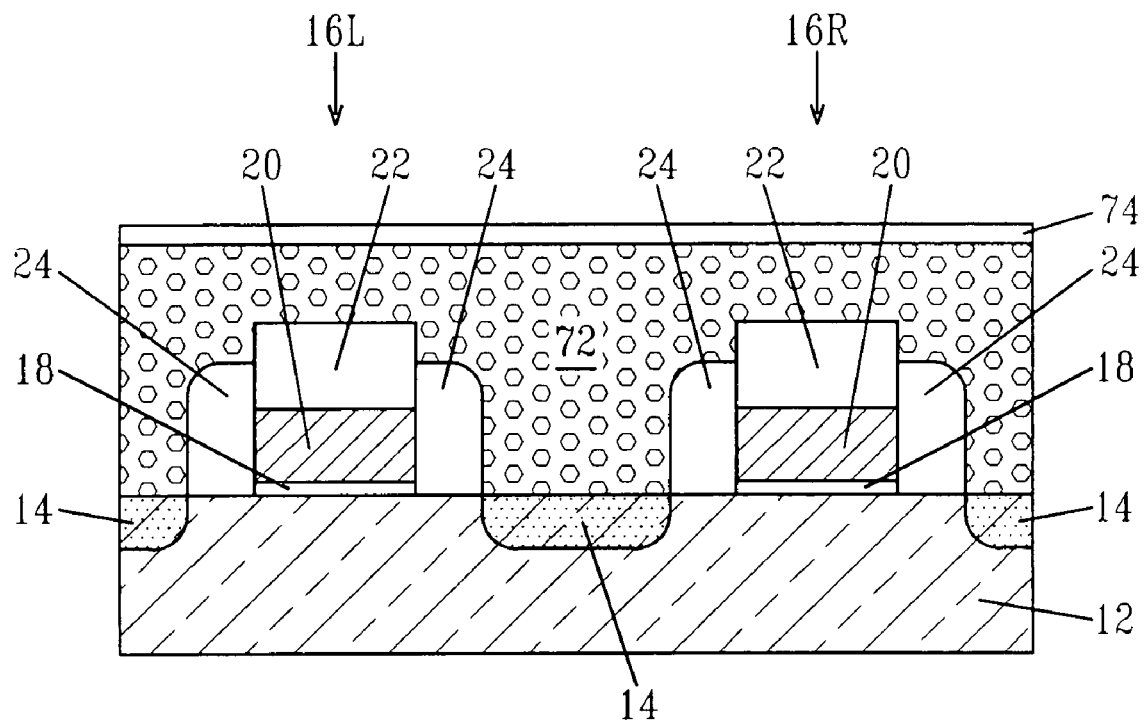

Next, and as shown in FIG. 5B, a planarizing material 72 such as BSG, PSG or an oxide is applied to the initial structure 70. Preferably, the planarizing material 70 in this embodiment of the present invention is an organic material. The planarizing material 72 is formed as described in the first method of the present invention.

Figure 5D:
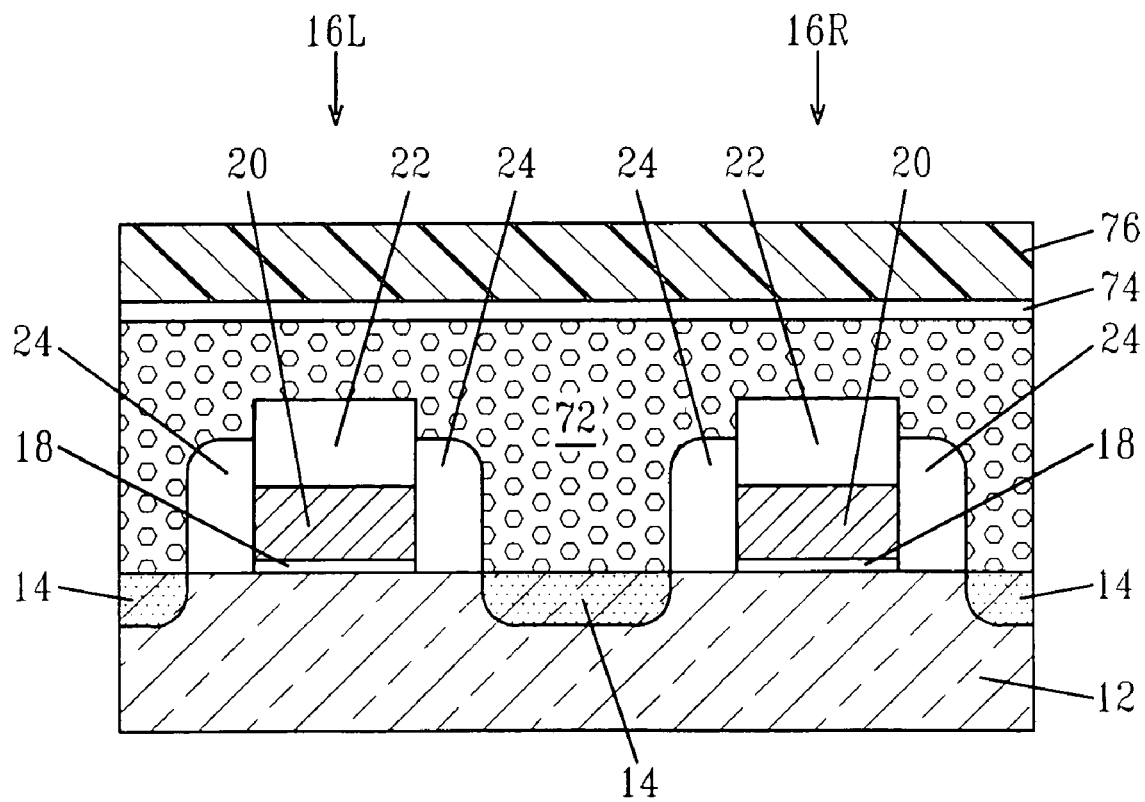
Figure 5E:
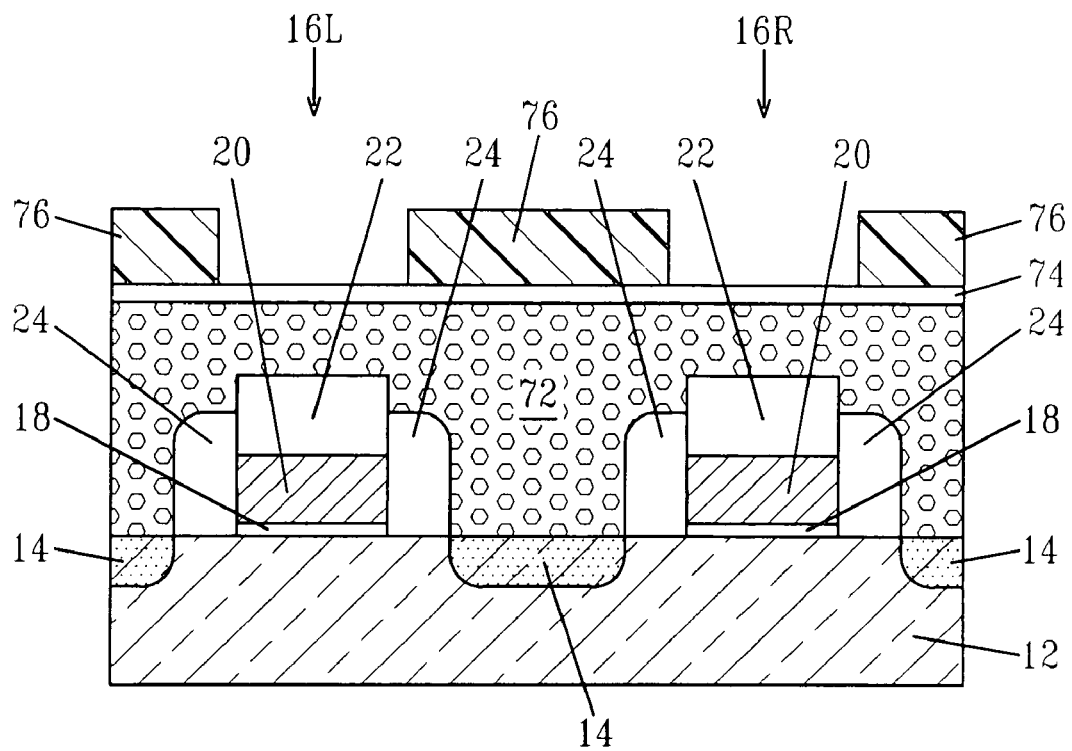
Figure 5F:
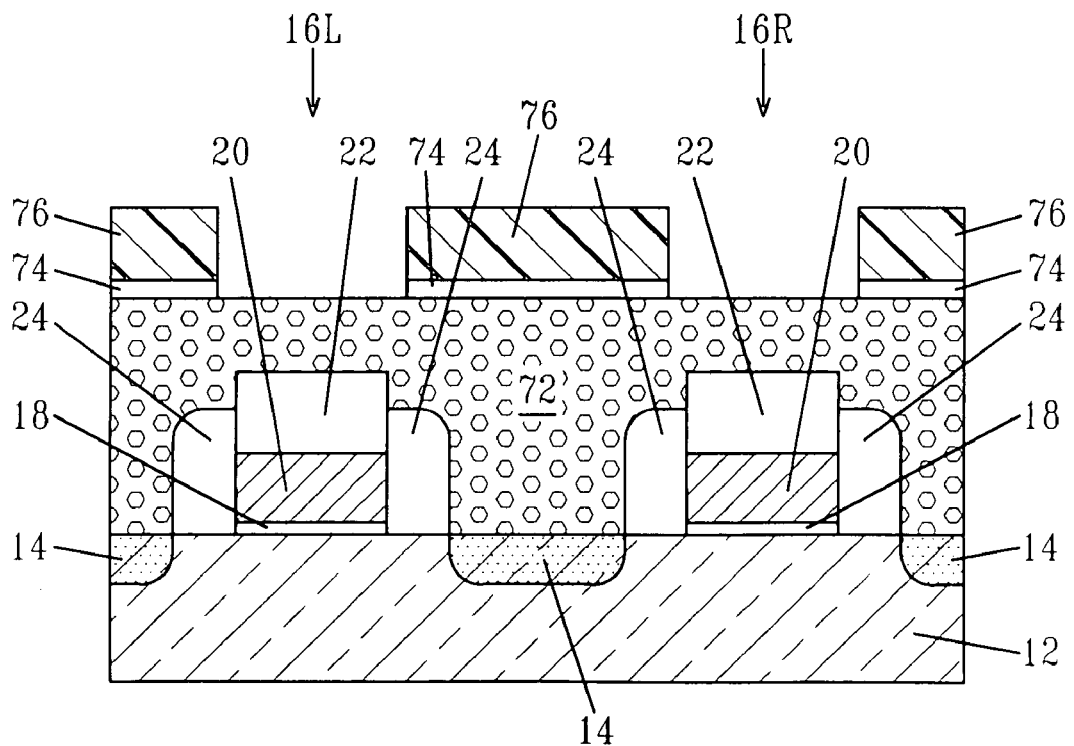

A masking layer 74 such as an oxide is then formed atop the planarizing material 72 utilizing a conventional deposition process. Masking layer 74 typically has a thickness after deposition from about 25 to about 75 nm. The masking layer 74 is then patterned by lithography and etching. These steps are shown in FIGS. 5D-5F. In particular, FIG. 5D shows the structure after a photoresist 76 is formed atop the masking layer. FIG. 5E shows the structure after photoresist 76 has been patterned via exposure and development, and FIG. 5F shows the structure after the pattern is transferred from the photoresist 76 into the masking layer 74. The transfer of the pattern occurs by an etching process such as reactive-ion etching or another like dry etching process.

Figure 5G:
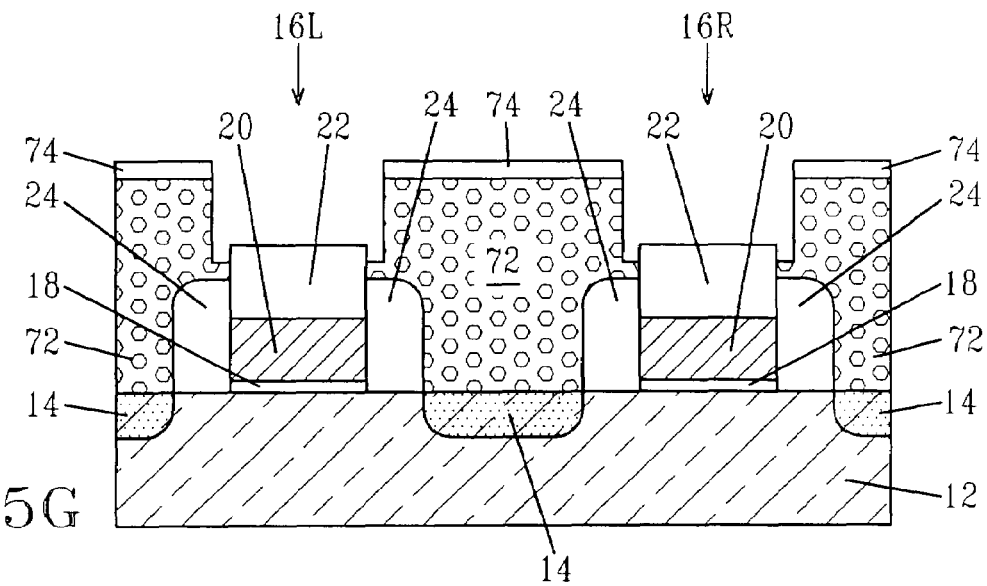

Next, and as shown in FIG. 5G, the pattern is transferred into the planarizing material 72 by a dry etching process that also consumes the photoresist 76. For example, reactive ion etching (RIE) can be used to transfer the pattern into the planarizing material and consume the photoresist. Note that this step exposes the top surface of the dielectric cap 22.

Figure 5H:
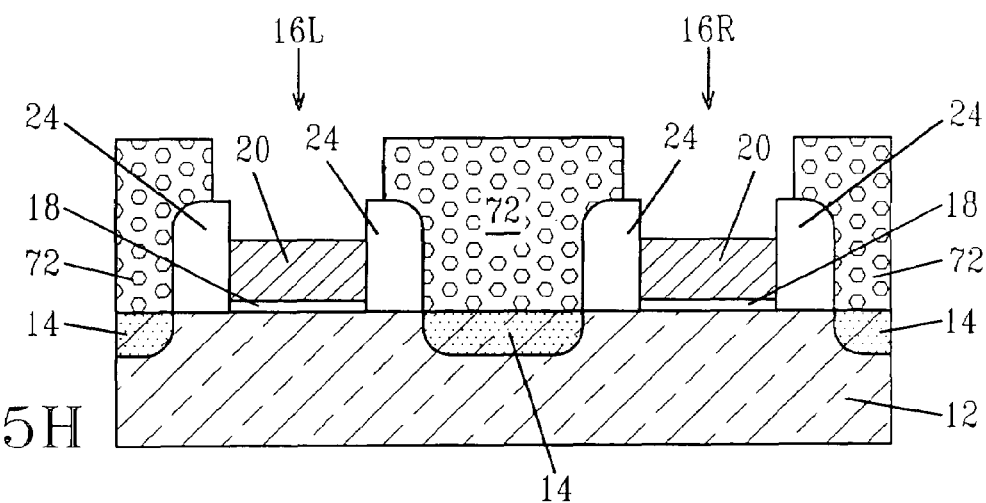

The dielectric cap 22 and the remaining masking layer 74 is then removed utilizing a dry etching process as described above in the second method of the present invention providing the structure shown in FIG. 5H. During the removal of the dielectric cap 22, the underlying polySi gate conductor 20 is exposed. The remaining planarizing material 72 is then stripped and processing of the fully silicided metal gate and silicided source/drain regions can be performed as described above. Alternatively, the silicided source/drain regions can be formed prior to forming the planarizing material 72 on the structure. A lift-off layer as described above can also be employed in this method as well.

Figure 5I:
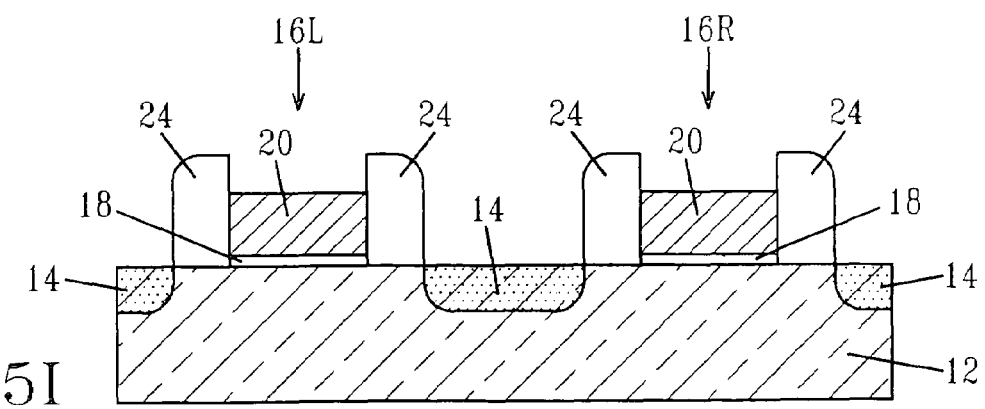
Figure 6A:
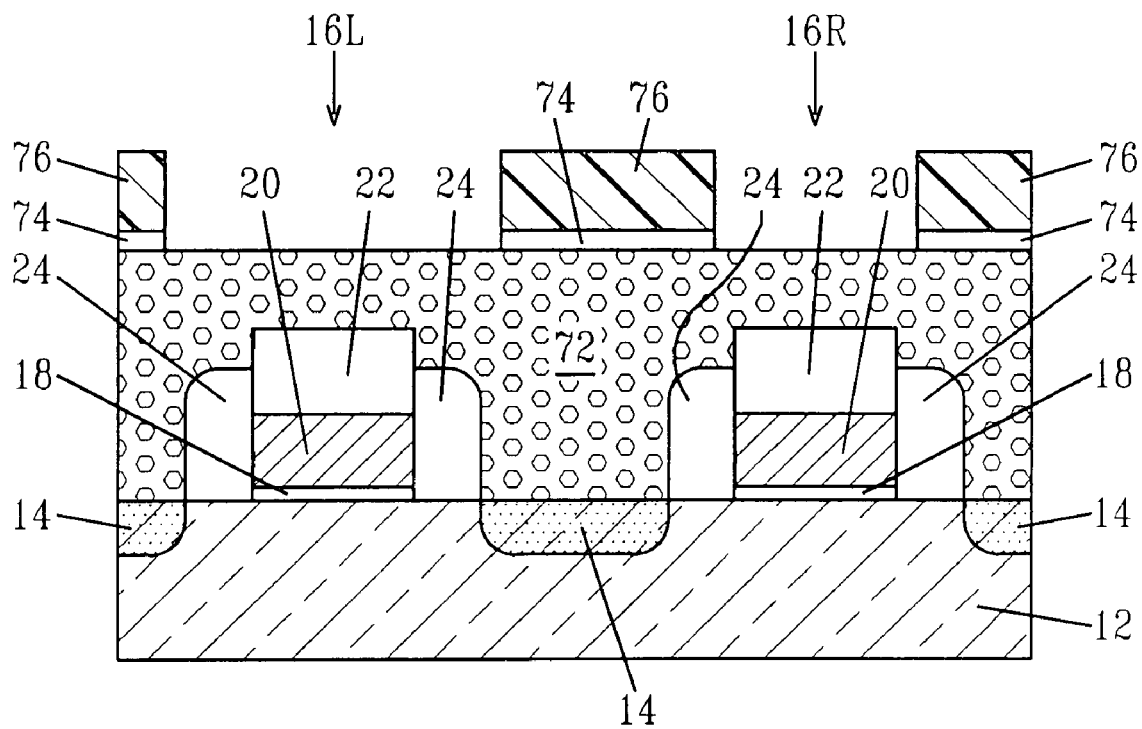
FIGS. 6A-6D are pictorial representations (through cross-sectional views) illustrating how a planarizing layer protects the underlying material and circumvents critical dimension (CD) biasing and misalignment inherent to lithography.
Figure 6B:
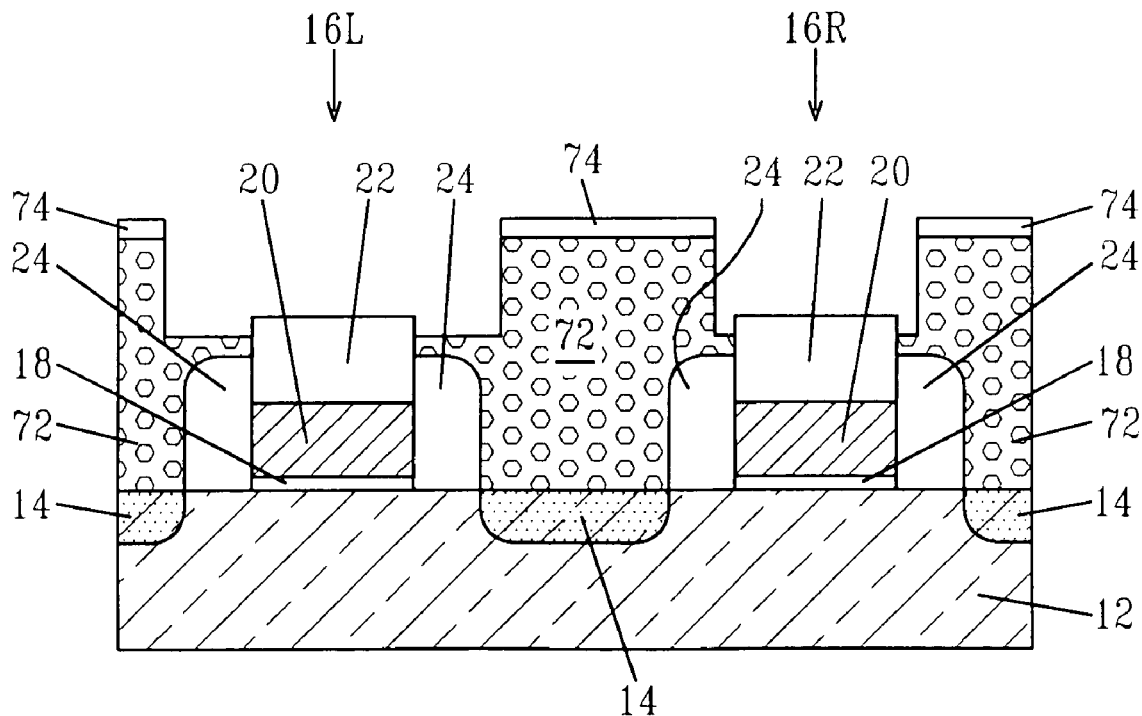
Figure 6C:
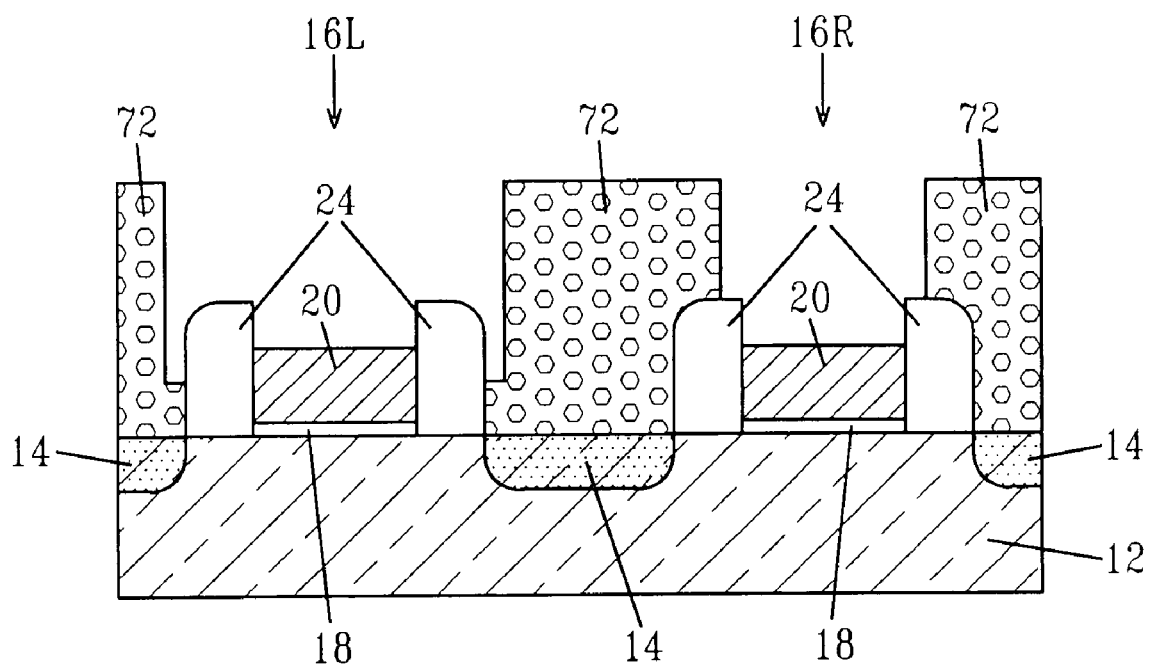
Figure 6D:
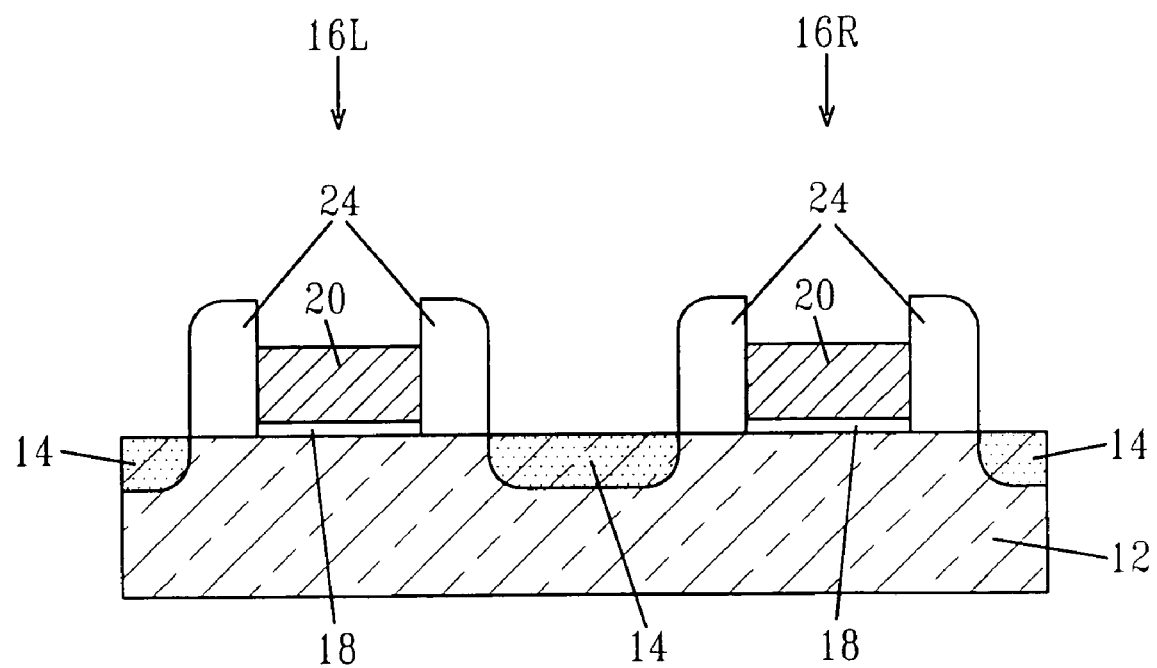
Figure 7A:
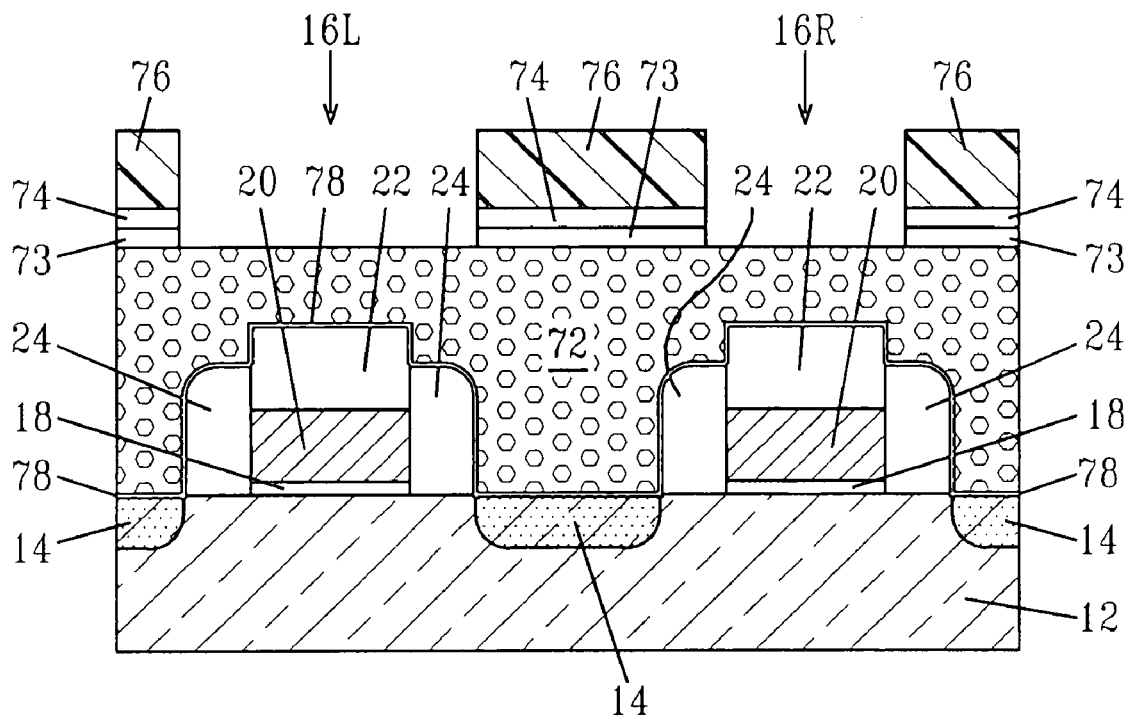
FIGS. 7A-7E are pictorial representations (through cross-sectional views) illustrating one lift-off scheme that can be used in conjugation with a planarizing layer.
Figure 7B:
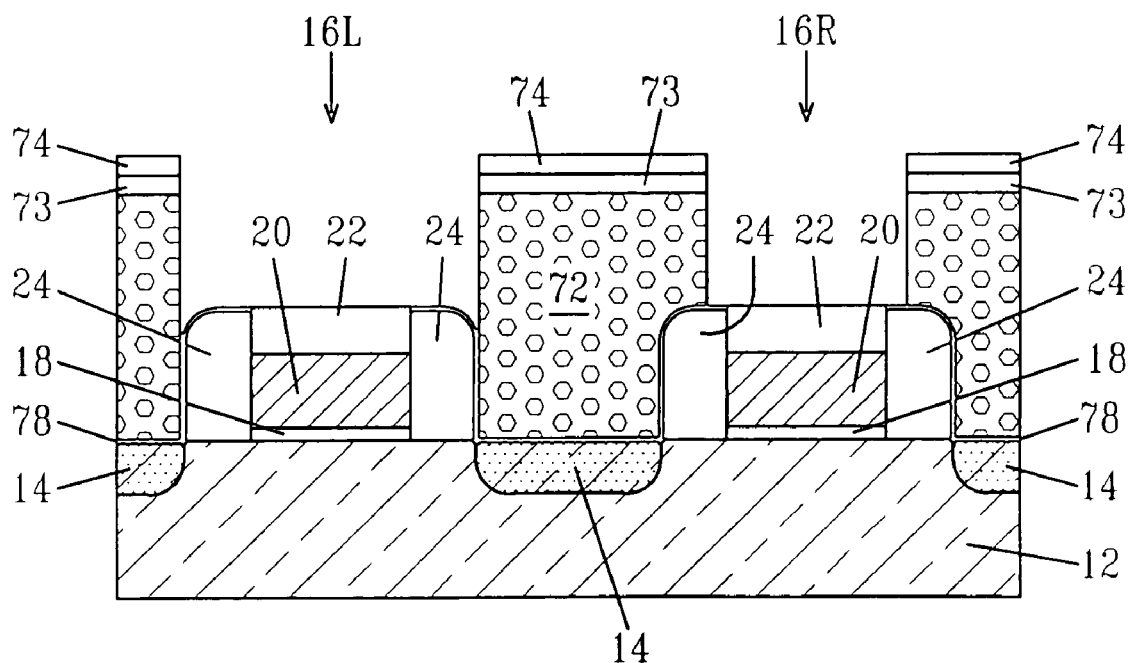
Figure 7C:
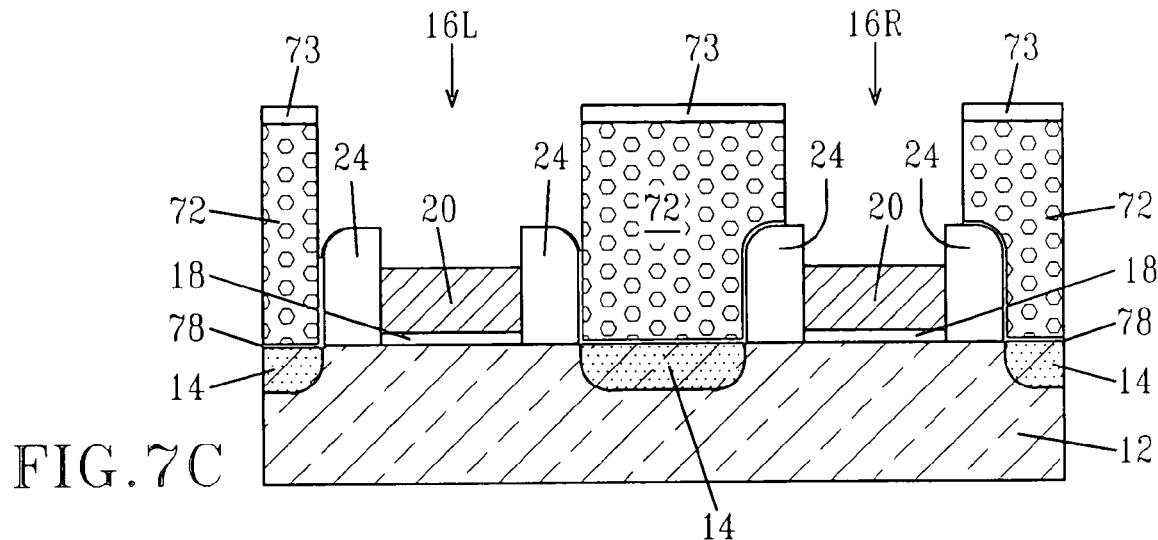
Figure 7D:
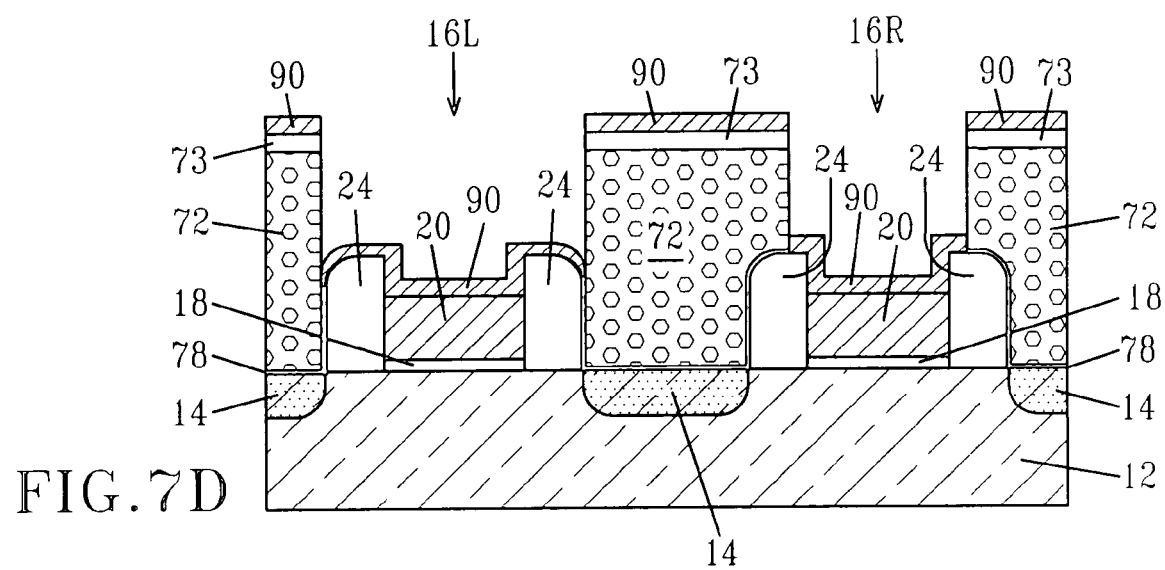
Figure 7E:
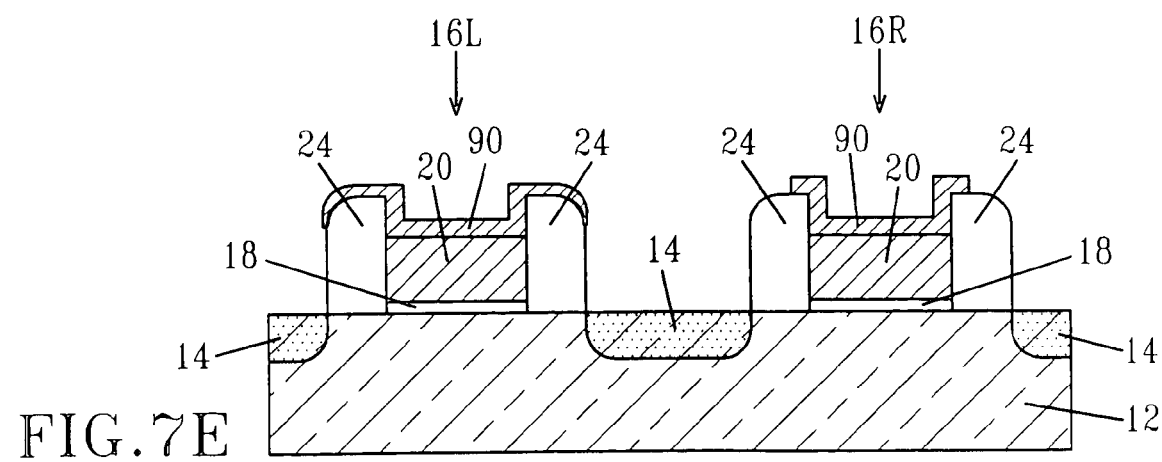
Figure 8A:
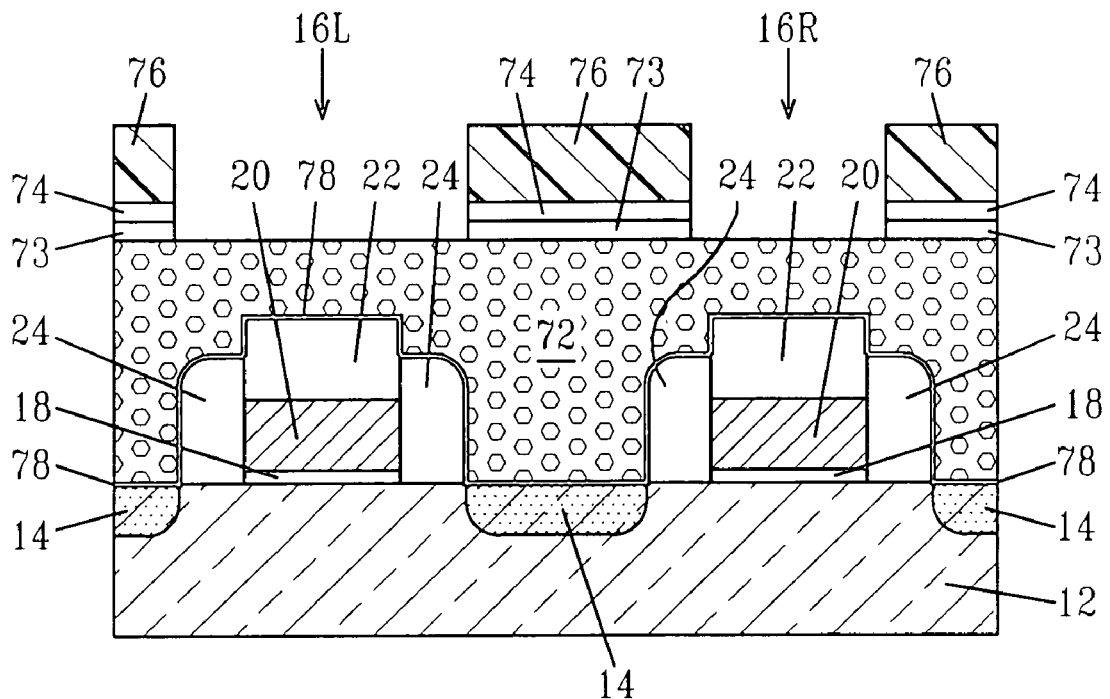
FIGS. 8A-8F are pictorial representations (through cross-sectional views) illustrating another lift-off scheme that can be used in conjugation with a planarizing layer.
Figure 8B:
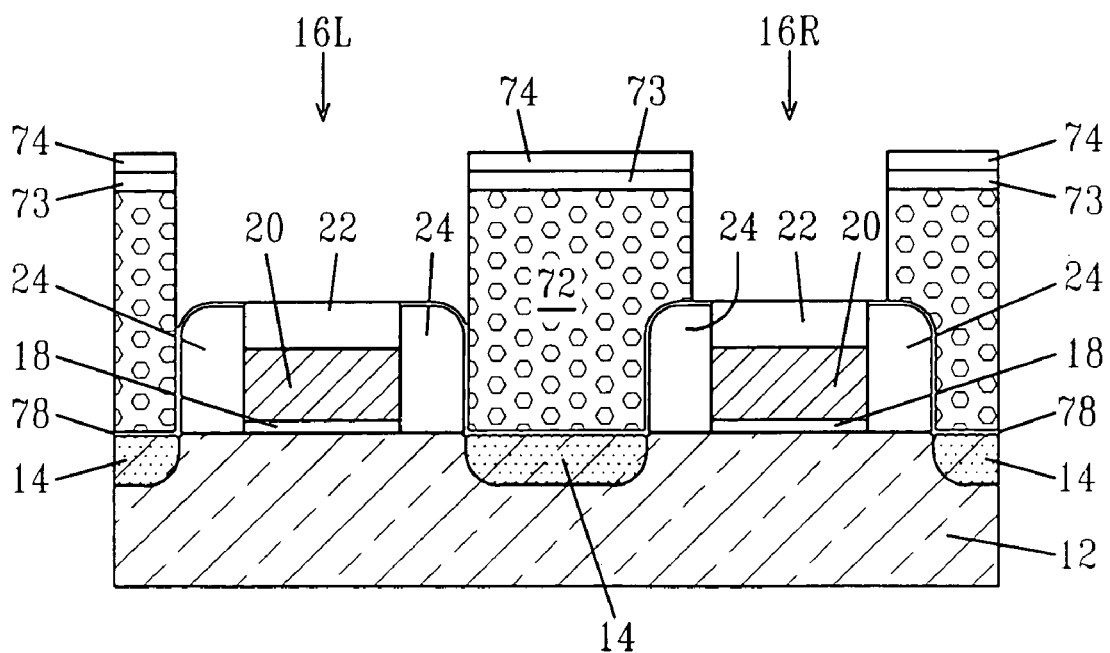
Figure 8C:
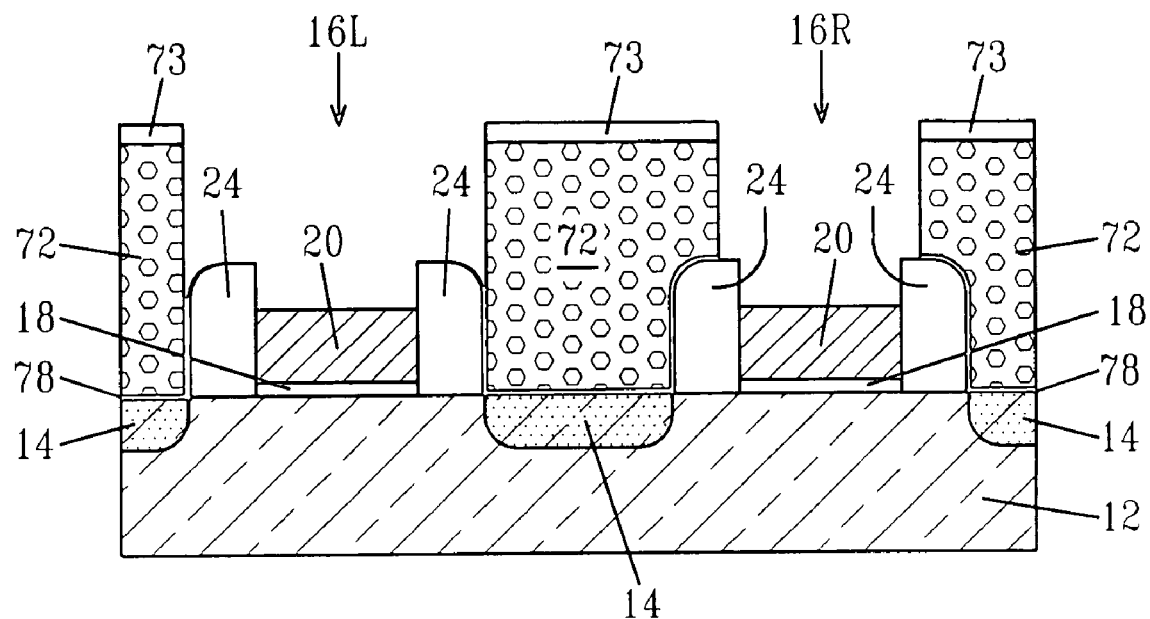
Figure 8D:
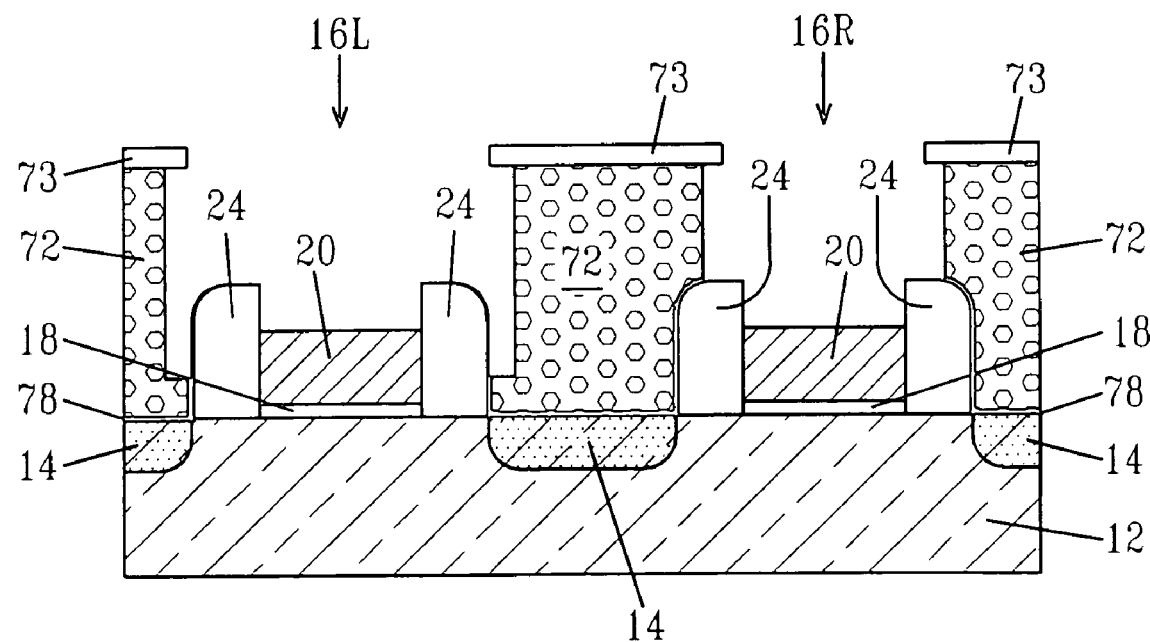
Figure 8E:
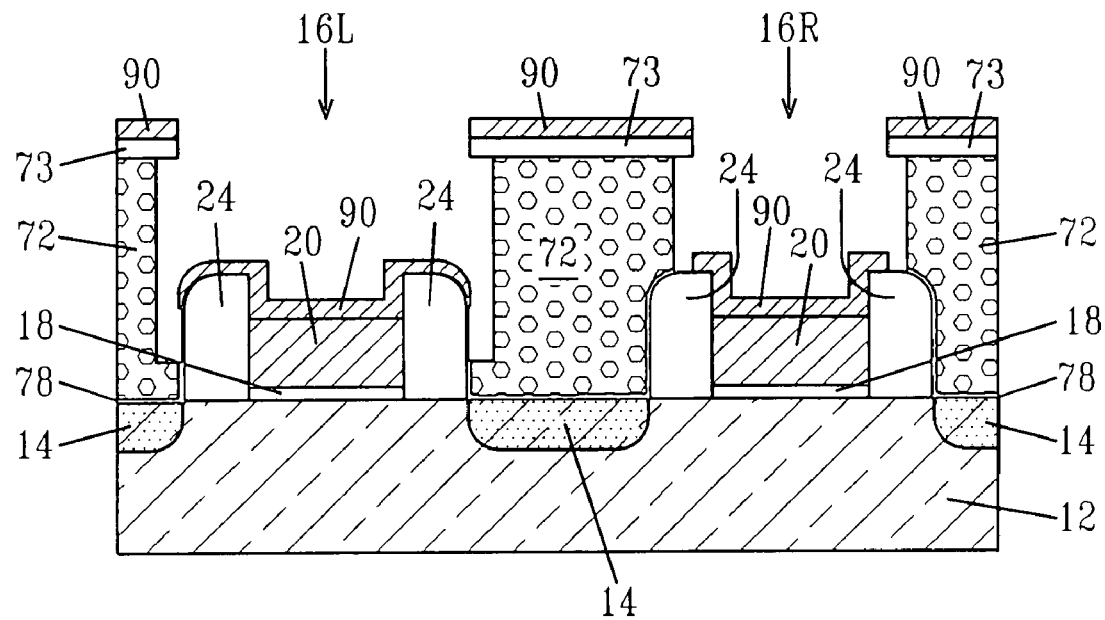
Figure 8F:
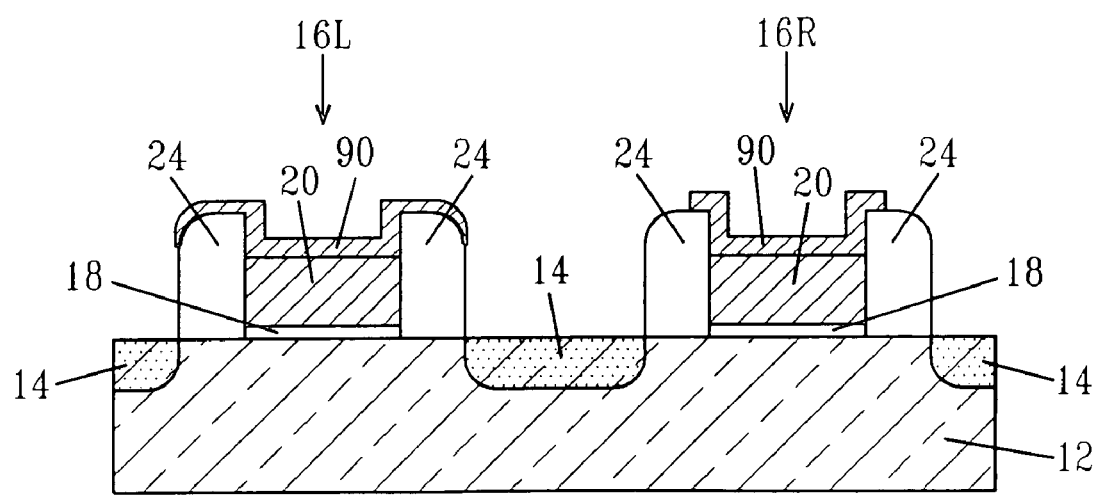

FIG. 5I shows the structure after planarizing material 72 has been removed.

FIGS. 6A-6D show how the planarizing material 72 protects the underlying material and circumvents the CD bias and misalignment inherent to lithography and dry etching methods as is known to those skilled in the art. Note that the elements in these drawings are the same as that shown in FIGS. 5A-5I. The significance of the process shown in FIGS. 6A-6D is that even in the event of increased CD or overlay mismatch the source and drain regions and the trench isolation regions are still protected. Note that the structure shown in FIG. 6D can be processed as described above such that a fully silicided metal gate and silicided source/drain regions are formed therein.

FIGS. 7A-7E and FIGS. 8A-8F show embodiments in which a lift-off layer 78 is used in conjunction with planarizing material 72. The basic processing steps and materials used in these embodiments have been described in greater detail above. Therefore, there is no need to repeat the processing steps here. Layer 78 is a lift-off layer. Note that lift-off layer 78 is the same material as lift-off layer 62 depicted in the previous drawings.

FIGS. 7A-7E illustrate how a planarizing organic scheme such as shown in FIGS. 5A-5I can be used in conjunction with a lift-off layer. In these drawings, the lift-off layer 78, the planarizing organic layer 72, a stack comprising a first hard mask 73 and a second hard mask 74 are employed and are deposited in the order indicated. Resist 76 is then applied and patterned. The resist pattern is first transferred into the hard mask stack and thereafter into the planarizing organic layer 72 while at the same time consuming photoresist 76. The lift-off layer 78 above the dielectric cap and the underlying dielectric cap 22 are then removed as described above. A metal silicide, labeled as 90 in the drawings, is then applied atop the exposed surface of the dielectric cap and then the remaining lift-off layer and material layers above the lift-off layer are removed. At least one silicide anneal is then performed.

FIGS. 8A-8F describe a different embodiment where the planarizing organic layer 72 can be slightly undercut through an isotropic etch after the dielectric cap 22 has been removed. This embodiment would make the lift-off process more robust.

It should be noted that in the various embodiments described above, liner 23 can be employed. Also, in embodiments in which a photoresist is employed, lift-off technology can be used.

As indicated above, the various methods of the present invention provide a MOS structure having fully silicided metal gates and abutting silicided source/drain regions in which the silicided source drains regions have a thickness that is thinner than the fully silicided metal gates. Specifically, the thickness of the silicided metal gates is greater than 500 Å and the thickness of the silicided source/drain regions is less than 500 Å, preferably less than 300 Å, and even more preferably less than 200 Å.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A semiconductor structure comprising a fully silicided metal gate of a first silicide metal having a first thickness and abutting silicided source and drain regions of a second silicide metal having a second thickness, wherein said second thickness is less than the first thickness and said silicided source and drain regions are aligned to edges of a gate region including at least the fully silicided metal gate and said fully silicided metal gate has sidewalls that are in direct contact with a nitride spacer, wherein the silicided source and drain regions are comprised of a different silicide metal than the fully silicided metal gate, wherein a metal element of the fully silicided metal gate is not present in the silicide source and drain regions, wherein the fully silicide metal comprises NiSi, NiPtSi or a combination thereof, and said silicided source and drain regions comprise $CoSi_2$.

2. The semiconductor structure of claim 1 wherein said first thickness is greater than 500 Å and the second thickness is less than 500 Å.

3. The semiconductor structure of claim 2 wherein said second thickness is less than 300 Å.

4. The semiconductor structure of claim 2 wherein said second thickness is less than 200 Å.

5. A metal oxide semiconductor (MOS) device comprising a semiconductor substrate having silicided source and drain regions located on a surface thereof, said silicided source and drain regions having a thickness of less than 500 Å and are self-aligned to edges of a gate region that comprises a fully silicided metal gate, said fully silicided metal gate having a thickness of greater than 500 Å, and said fully silicided metal gate has sidewalls that are in direct contact with a nitride spacer, wherein the silicided source and drain regions are comprised of a different silicide metal than the fully silicided metal gate, wherein a metal element of the fully silicided metal gate is not present in the silicided source and drain regions, wherein the fully silicide metal comprises NiSi, NiPtSi or a combination thereof, and said silicided source and drain regions comprise $CoSi_2$.

6. The MOS device of claim 5 wherein said thickness of said silicided source/and drain regions is less than 300 Å.

7. The MOS device semiconductor structure of claim 5 wherein said thickness of said silicided source and drain regions is less than 200 Å.

* * * * *